United States Patent
Majumdar et al.

(10) Patent No.: US 7,414,313 B2
(45) Date of Patent: Aug. 19, 2008

(54) POLYMERIC CONDUCTOR DONOR AND TRANSFER METHOD

(75) Inventors: Debasis Majumdar, Rochester, NY (US); Glen C. Irvin, Jr., Rochester, NY (US); Charles C. Anderson, Penfield, NY (US); Gary S. Freedman, Webster, NY (US); Robert J. Kress, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/022,155

(22) Filed: Dec. 22, 2004

(65) Prior Publication Data

US 2006/0131703 A1    Jun. 22, 2006

(51) Int. Cl.
   *H01L 29/47*   (2006.01)
(52) U.S. Cl. ............... 257/741; 257/736; 257/746; 257/40; 257/627; 257/665; 257/784; 257/E23.078; 257/E23.106; 438/584; 438/627; 438/616; 438/458
(58) Field of Classification Search ............... 438/584, 438/627, 616, 458; 257/40, 665, 741, 784, 257/746, 736, E23.078, E23.106
   See application file for complete search history.

(56) References Cited

U.S. PATENT DOCUMENTS

| | | | |
|---|---|---|---|
| 4,070,189 A | 1/1978 | Kelley et al. | |
| 4,987,042 A | 1/1991 | Jonas et al. | |
| 5,093,439 A | 3/1992 | Epstein et al. | |
| 5,124,220 A * | 6/1992 | Brown et al. | 430/67 |
| 5,171,650 A | 12/1992 | Ellis et al. | |
| 5,300,575 A | 4/1994 | Jonas et al. | |
| 5,312,681 A | 5/1994 | Muys et al. | |
| 5,354,613 A | 10/1994 | Quintens et al. | |
| 5,370,981 A | 12/1994 | Krafft et al. | |
| 5,372,924 A | 12/1994 | Quintens et al. | |
| 5,391,472 A | 2/1995 | Muys et al. | |
| 5,403,467 A | 4/1995 | Jonas et al. | |
| 5,443,944 A | 8/1995 | Krafft et al. | |
| 5,575,898 A | 11/1996 | Wolf et al. | |
| 5,665,498 A | 9/1997 | Savage et al. | |
| 5,674,654 A | 10/1997 | Zumbulyadis et al. | |
| 5,716,550 A | 2/1998 | Gardner et al. | |

(Continued)

FOREIGN PATENT DOCUMENTS

EP    0 440 957    3/1996

(Continued)

OTHER PUBLICATIONS

Gene Chase, ETS, Inc.; Ohms Per Square What!; ESD Journal: http://www.esdjournal.com/techpapr/ohms.htm posted: Feb. 17, 2001 pp. 1-3.*

(Continued)

*Primary Examiner*—Fernando L. Toledo
*Assistant Examiner*—Jarrett J Stark
(74) *Attorney, Agent, or Firm*—Paul A. Leipold; Andrew J. Anderson

(57) ABSTRACT

The present invention relates to a donor laminate for transfer of a conductive layer comprising at least one electronically conductive polymer on to a receiver, wherein the receiver is a component of a device. The present invention also relates to methods pertinent to such transfers.

17 Claims, 9 Drawing Sheets

U.S. PATENT DOCUMENTS

| | | | |
|---|---|---|---|
| 5,828,432 A | 10/1998 | Shashidhar et al. | |
| 5,976,274 A | 11/1999 | Inoue et al. | |
| 5,976,284 A | 11/1999 | Calvert et al. | |
| 6,045,977 A | 4/2000 | Chandross et al. | |
| 6,096,491 A | 8/2000 | Majumdar et al. | |
| 6,114,088 A | 9/2000 | Wolk et al. | |
| 6,124,083 A | 9/2000 | Majumdar et al. | |
| 6,140,009 A | 10/2000 | Wolk et al. | |
| 6,178,034 B1 * | 1/2001 | Allemand et al. | 359/265 |
| 6,190,846 B1 | 2/2001 | Majumdar et al. | |
| 6,214,520 B1 | 4/2001 | Wolk et al. | |
| 6,221,553 B1 | 4/2001 | Wolk et al. | |
| 6,404,120 B1 | 6/2002 | Aben et al. | |
| 6,582,876 B2 | 6/2003 | Wolk et al. | |
| 6,586,153 B2 | 7/2003 | Wolk et al. | |
| 6,639,637 B2 | 10/2003 | Stephenson | |
| 6,707,517 B2 | 3/2004 | Stephenson | |
| 6,737,293 B2 | 5/2004 | Andriessen | |
| 6,878,643 B2 * | 4/2005 | Krulevitch et al. | 438/780 |
| 6,939,828 B2 * | 9/2005 | Arrington et al. | 503/227 |
| 6,991,963 B2 * | 1/2006 | Krulevitch et al. | 438/106 |
| 6,998,175 B2 * | 2/2006 | Murata et al. | 428/354 |
| 7,030,411 B2 * | 4/2006 | Krulevitch et al. | 257/57 |
| 7,138,170 B2 * | 11/2006 | Bourdelais et al. | 428/188 |
| 7,189,676 B2 * | 3/2007 | Bourdelais et al. | 503/227 |
| 2003/0008135 A1 | 1/2003 | Kawamura et al. | |
| 2004/0065970 A1 | 4/2004 | Blanchet-Fincher | |
| 2004/0121528 A1 * | 6/2004 | Krulevitch et al. | 438/166 |
| 2004/0209396 A1 * | 10/2004 | Krulevitch et al. | 438/106 |
| 2005/0030698 A1 * | 2/2005 | Krulevitch et al. | 361/301.4 |
| 2005/0150936 A1 * | 7/2005 | Mackay | 228/254 |
| 2006/0051549 A1 * | 3/2006 | Mano | 428/40.1 |
| 2006/0062975 A1 | 3/2006 | Majumdar et al. | |
| 2006/0062983 A1 | 3/2006 | Irvin, Jr. et al. | |
| 2006/0088698 A1 | 4/2006 | Majumdar et al. | |
| 2006/0188721 A1 * | 8/2006 | Irvin et al. | 438/402 |
| 2006/0274048 A1 * | 12/2006 | Spath et al. | 345/173 |
| 2007/0087153 A1 * | 4/2007 | Port et al. | 428/40.1 |

FOREIGN PATENT DOCUMENTS

| | | |
|---|---|---|
| EP | 0 615 256 | 9/1998 |
| EP | 0 686 662 | 11/2002 |
| EP | 1 054 414 | 3/2003 |
| WO | WO 97/18944 | 5/1997 |
| WO | WO 00/39835 | 7/2000 |

OTHER PUBLICATIONS

Steve Fowle.; Ohms Per Square What?; ESD Journal: http://www.esdjournal.com/techpapr/ohmmtr/ohm.htm posted: Feb. 17, 2001 pp. 1-3.*

Research Disclosure No. 41548, *Research Disclosure*, Nov. 1998, p. 1473, Kenneth Mason Publications Ltd., Hampshire, England.

*Synthetic Metals*, vol. 142 (2004), pp. 187-193, B. D. Martin et al.

* cited by examiner

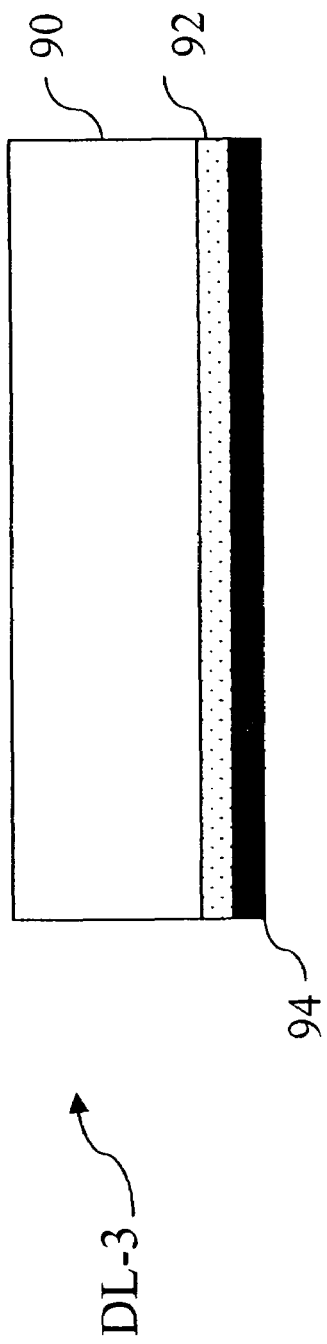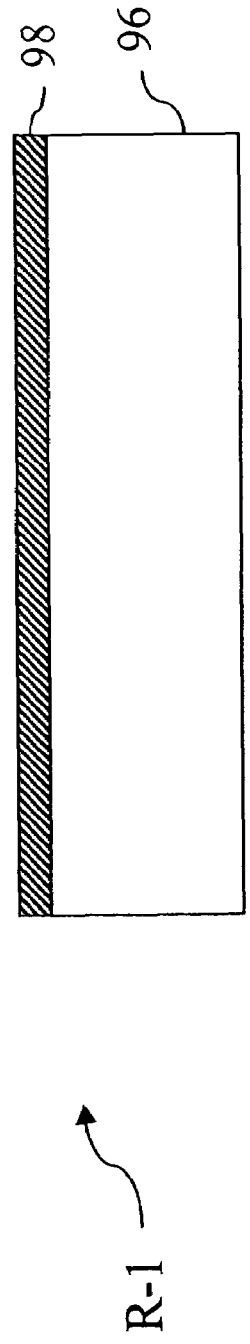
FIG. 7A
FIG. 7B

US 7,414,313 B2

POLYMERIC CONDUCTOR DONOR AND TRANSFER METHOD

FIELD OF THE INVENTION

The present invention relates to a donor laminate for transfer of a conductive layer comprising at least one electronically conductive polymer on to a receiver, wherein the receiver is a component of a device. The present invention also relates to methods pertinent to such transfers.

BACKGROUND OF THE INVENTION

Transparent electrically-conductive layers (TCL) of metal oxides such as indium tin oxide (ITO), antimony doped tin oxide, and cadmium stannate (cadmium tin oxide) are commonly used in the manufacture of electrooptical display devices such as liquid crystal display devices (LCDs), electroluminescent display devices, photocells, solid-state image sensors, electrochromic windows and the like.

Devices such as flat panel displays, typically contain a substrate provided with an indium tin oxide (ITO) layer as a transparent electrode. The coating of ITO is carried out by vacuum sputtering methods which involve high substrate temperature conditions up to 250° C., and therefore, glass substrates are generally used. The high cost of the fabrication methods and the low flexibility of such electrodes, due to the brittleness of the inorganic ITO layer as well as the glass substrate, limit the range of potential applications. As a result, there is a growing interest in making all-organic devices, comprising plastic resins as a flexible substrate and organic electroconductive polymer layers as an electrode. Such plastic electronics allow low cost devices with new properties. Flexible plastic substrates can be provided with an electroconductive polymer layer by continuous hopper or roller coating methods (compared to batch process such as sputtering) and the resulting organic electrodes enable the "roll to roll" fabrication of electronic devices which are more flexible, lower cost, and lower weight.

Electronically conductive polymers have recently received attention from various industries because of their electronic conductivity. Although many of these polymers are highly colored and are less suited for TCL applications, some of these electronically conductive polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408) and substituted or unsubstituted aniline-containing polymers (as mentioned in U.S. Pat. Nos. 5,716,550, 5,093,439, and 4,070,189) are transparent and not prohibitively colored, at least when coated in thin layers at moderate coverage. Because of their electronic conductivity these polymers can provide excellent process-surviving, humidity independent antistatic characteristics when coated on plastic substrates used for photographic imaging applications (vide, for example, U.S. Pat. Nos. 6,096,491; 6,124,083; 6,190,846;)

EP-A-440 957 describes a method for preparing polythiophene in an aqueous mixture by oxidative polymerization in the presence of a polyanion as a doping agent. In EP-A-686 662 it has been disclosed that highly conductive layers of polythiophene, coated from an aqueous coating solution, could be made by the addition of a di- or polyhydroxy and/or a carbonic acid, amide or lactam group containing compound in the coating solution of the polythiophene.

Many miniature electronic and optical devices are formed using layers of different materials stacked on each other. These layers are often patterned to produce the devices. Examples of such devices include optical displays in which each pixel is formed in a patterned array, optical waveguide structures for telecommunication devices, and metal-insulator-metal stacks for semiconductor-based devices. A conventional method for making these devices includes forming one or more layers on a receiver substrate and patterning the layers simultaneously or sequentially to form the device. In many cases, multiple deposition and patterning steps are required to prepare the ultimate device structure. For example, the preparation of optical displays may require the separate formation of red, green, and blue pixels. Although some layers may be commonly deposited for each of these types of pixels, at least some layers must be separately formed and often separately patterned. Patterning of the layers is often performed by photolithographic techniques that include, for example, covering a layer with a photoresist, patterning the photoresist using a mask, removing a portion of the photoresist to expose the underlying layer according to the pattern, and then etching the exposed layer.

Coated layers of organic electroconductive polymers can be patterned into electrode arrays using different methods. The known wet-etching microlithography technique is described in WO97/18944 and U.S. Pat. No. 5,976,274 wherein a positive or negative photoresist is applied on top of a coated layer of an organic electroconductive polymer, and after the steps of selectively exposing the photoresist to UV light, developing the photoresist, etching the electroconductive polymer layer and finally stripping the non-developed photoresist, a patterned layer is obtained. In U.S. Pat. No. 5,561,030 a similar method is used to form the pattern except that the pattern is formed in a continuous layer of prepolymer which is not yet conductive and that after washing the mask away the remaining prepolymer is rendered conductive by oxidation. Such methods that involve conventional lithographic techniques are cumbersome as they involve many steps and require the use of hazardous chemicals.

EP-A-615 256 describes a method to produce a pattern of a conductive polymer on a substrate that involves coating and drying a composition containing 3,4-ethylenedioxythiophene monomer, an oxidation agent, and a base; exposing the dried layer to UV radiation through a mask; and then heating. The UV exposed areas of the coating comprise nonconductive polymer and the unexposed areas comprise conductive polymer. The formation of a conductive polymer pattern in accordance with this method does not require the coating and patterning of a separate photoresist layer.

U.S. Pat. No. 6,045,977 describes a process for patterning conductive polyaniline layers containing a photobase generator. UV exposure of such layers produces a base that reduces the conductivity in the exposed areas.

EP-A-1 054 414 describes a method to pattern a conductive polymer layer by printing an electrode pattern onto said conductive polymer layer using a printing solution containing an oxidant selected from the group $ClO^-$, $BrO^-$, $MnO_4^-$, $Cr_2O_7^{-2}$, $S_2O_8^{-2}$, and $H_2O_2$. The area of the conductive layer exposed to the oxidant solution are rendered nonconductive.

Research Disclosure, November 1998, page 1473 (disclosure no. 41548) describes various means to form patterns in a conducting polymer, including photoablation wherein the selected areas are removed from the substrate by laser irradiation. Such photoablation processes are convenient, dry, one-step methods but the generation of debris may require a wet cleaning step and may contaminate the optics and mechanics of the laser device. Prior art methods involving removal of the electroconductive polymer to form the electrode pattern also induce a difference of the optical density between electroconductive and non-conductive areas of the patterned surface.

Methods of patterning organic electroconductive polymer layers by image-wise heating by means of a laser have been disclosed in EP 1 079 397 A1. That method induces about a 10 to 1000 fold decrease in resistivity without substantially ablating or destroying the layer.

The application of electronically conductive polymers in display related devices has been envisioned in the past. European Patent Application EP9910201 describes a light transmissive substrate having a light transmissive conductive polymer coating for use in resistive touch screens. U.S. Pat. No. 5,738,934 describes touch screen cover sheets having a conductive polymer coating.

U.S. Pat. Nos. 5,828,432 and 5,976,284 describe conductive polymer layers employed in liquid crystal display devices. The example conductive layers are highly conductive but typically have transparency of 60% or less.

Use of polythiophene as transparent field spreading layers in displays comprising polymer dispersed liquid crystals has been disclosed in U.S. Pat. Nos. 6,639,637 and 6,707,517. However, the polythiophene layers in these patents are non-conductive in nature.

Use of transparent coating on glass substrates for cathode ray tubes using polythiophene and silicon oxide composites has been disclosed in U.S. Pat. No. 6,404,120. However, the method suggests in-situ polymerization of an ethylenedioxythiohene monomer on glass, baking it at an elevated temperature and subsequent washing with tetra ethyl orthosilicate. Such an involved process may be difficult to practice for roll-to-roll production of a wide flexible plastic substrate.

Use of in-situ polymerized polythiophene and polypyrrole has been proposed in U.S. Pat Appl. Pub. 2003/0008135 A1 as conductive films, for ITO replacement. As mentioned earlier, such processes are difficult to implement for roll-to-roll production of conductive coatings. In the same patent application, a comparative example was created using a dispersion of poly(3,4 ethylene dioxythiophene)/polystyrene sulfonic acid which resulted in inferior coating properties.

Use of commercial polythiophene coated sheet such as Orgacon from Agfa has been suggested for manufacturing of thin film inorganic light emitting diode has been suggested in U.S. Pat. No. 6,737,293. However, the transparency vs. surface electrical resistivity of such products may not be sufficient for some applications.

Although there is considerable art describing various methods to form and pattern electronically conductive polymers, there are some applications where it may be difficult or impractical to involve any wet processing or cumbersome patterning steps. For example, wet processing during coating and/or patterning may adversely affect integrity, interfacial characteristics, and/or electrical or optical properties of the previously deposited layers. Additionally, the device manufacturer may not have coating facilities to handle large quantity of liquid. It is conceivable that many potentially advantageous device constructions, designs, layouts, and materials are impractical because of the limitations of conventional wet coating and patterning. There is a need for new methods of forming these devices with a reduced number of processing steps, particularly wet processing steps. In at least some instances, this may allow for the construction of devices with more reliability and more complexity.

Use of thermal transfer elements and thermal transfer methods for forming multicomponent devices have been proposed previously. For example, Wolk et al. in a series of patents (e.g., U.S. Pat. Nos. 6,114,088; 6,140,009; 6,214,520; 6,221,553; 6,582,876; 6,586,153) disclose thermal transfer elements and methods, for multilayer devices. However, such elements are non-transparent, often including a light-to-heat conversion layer, interlayer, release layer and the like. Construction of such multilayered elements are complex, involved and prone to defects that can get incorporated into the final device. Ellis et al. (U.S. Pat. No. 5,171,650) and Blanchet-Fincher (U.S. Pat. Appl. Pub. 2004/0065970 A1) describe ablative laser thermal transfer of conductive layers. However, such methods are prone to creating dirt and debris that may not be tolerated for many display applications.

PROBLEM TO BE SOLVED

Thus, there is still a need in the art for a suitable transfer element and a transfer method to form conductive layers, especially those comprising electronically conductive polymers on receiver substrates, and incorporating such receivers in electronic and/or optical devices.

SUMMARY OF THE INVENTION

It is an object of the invention to provide a donor laminate for transfer of an electronically conductive layer to a receiver element.

It is another object to provide methods to transfer an electronically conductive layer to a receiver element.

It is still another object to provide methods to transfer an electronically conductive layer to a receiver element in an electrode pattern.

These and other objects of the invention are accomplished by a donor laminate for transfer of a conductive layer comprising a substrate having thereon, in order, a silicone layer, and a conductive layer comprising at least one electronically conductive polymer and a polyanion, in contact with said silicone layer.

BRIEF DESCRIPTION OF THE DRAWINGS

FIG. 7 shows a cross-sectional representation of a donor laminate of the invention and a receiver element.

ADVANTAGEOUS EFFECT OF THE INVENTION

Figure 1:
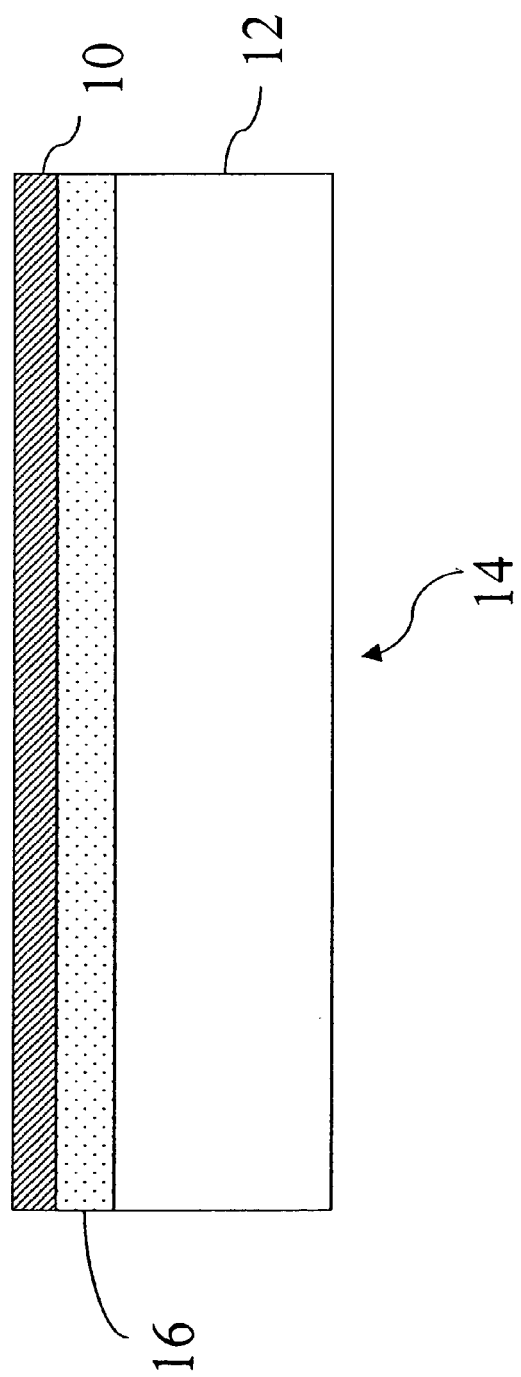
FIG. 1 shows a cross-sectional representation of a donor laminate of the invention.

The invention provides a desirable transfer element and a transfer method to form conductive layers, especially those comprising electronically conductive polymers on receiver substrates, and incorporating such receivers in electronic and/or optical devices.

DETAILED DESCRIPTION OF THE INVENTION

Generally, the present invention relates to donor laminates and methods of using donor laminates for forming devices. More particularly, the present invention is directed to a donor laminate for transfer of a conductive layer comprising a substrate having thereon, in order, a silicone layer, and a conductive layer comprising at least one electronically conductive polymer and a polyanion, in contact with said silicone layer.

Optionally, the laminate further comprises one or more other layers disposed on the conductive layer, on the side of the conductive layer opposite to the silicone layer, that include operational layers and auxiliary layers of a device.

Another embodiment is a method of transferring a conductive layer to a receiver to form a device, including contacting a receiver with a donor laminate comprising a substrate having thereon, in order, a silicone layer, and a conductive layer comprising at least one electronically conductive polymer and a polyanion, in contact with said silicone layer. The present invention is applicable to the formation or partial formation of devices and other objects using various transfer mechanisms and donor laminate configurations for forming the devices or other objects.

The donor laminates of the invention can be used to form, for example, electronic circuitry, resistors, capacitors, diodes, rectifiers, electroluminescent lamps, memory elements, field effect transistors, bipolar transistors, unijunction transistors, MOS transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or combinations thereof; for example, the combination of field effect transistors and organic electroluminescent lamps as an active matrix array for an optical display.

Preferred embodiments are donor laminates for forming a polymer dispersed LC display, an OLED based display, or a resistive-type touch screen. The donor laminates include a substrate, a conductive layer, and one or more other layers that are configured and arranged to form, upon transfer to a receiver, at least two operational layers of the device. The present invention also includes a polymer dispersed LC display, an OLED based display, a resistive-type touch screen, or other electronic or optical device formed using the donor laminate.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

The term, "silicone layer" includes layers that comprise organic materials containing a Si—O bond.

The term, "device", includes an electronic or optical component that can be used by itself and/or with other components to form a larger system, such as an electronic circuit.

The term, "active device", includes an electronic or optical component capable of a dynamic function, such as amplification, oscillation, or signal control, and may require a power supply for operation.

The term, "passive device", includes an electronic or optical component that is basically static in operation (i.e., it is ordinarily incapable of amplification or oscillation) and may require no power for characteristic operation.

The term, "operational layer" includes layers that are utilized in the operation of device, such as a multilayer active or passive device. Examples of operational layers include layers that act as insulating, conducting, semiconducting, superconducting, waveguiding, frequency multiplying, light producing (e.g., luminescing, light emitting, fluorescing or phosphorescing), electron producing, hole producing, magnetic, light absorbing, reflecting, diffracting, phase retarding, scattering, dispersing, refracting, polarizing, or diffusing layers in the device and/or layers that produce an optical or electronic gain in the device.

The term, "auxiliary layer" includes layers that do not perform a function in the operation of the device, but are provided solely, for example, to facilitate transfer of a layer to a receiver element, to protect layers of the device from damage and/or contact with outside elements, and/or to adhere the transferred layer to the receiver element.

Turning now to FIG. 1 there is presented a cross-sectional representation of a donor laminate 14 comprising a substrate 12 having thereon a silicone layer 16, and a conductive layer 10 comprising an electronically conductive polymer and a polyanion, in contact with said silicone layer 16.

The substrate 12 can be transparent, translucent or opaque, rigid or flexible, and may be colored or colorless. Preferred substrates are transparent. Rigid substrates can include glass, metal, ceramic and/or semiconductors. Flexible substrates, especially those comprising a plastic substrate, are preferred for their versatility and ease of manufacturing, coating and finishing. Flexible plastic substrates can be any flexible self-supporting plastic film that supports the conductive layer. "Plastic" means a high polymer, usually made from polymeric synthetic resins, which may be combined with other ingredients, such as curatives, fillers, reinforcing agents, colorants, and plasticizers. Plastic includes thermoplastic materials and thermosetting materials.

The flexible plastic substrate has sufficient thickness and mechanical integrity so as to be self-supporting, yet should not be so thick as to be rigid. Another significant characteristic of the flexible plastic substrate material is its glass transition temperature (Tg). Tg is defined as the glass transition temperature at which plastic material will change from the glassy state to the rubbery state. It may comprise a range before the material may actually flow. Suitable materials for the flexible plastic substrate include thermoplastics of a relatively low glass transition temperature, for example up to 150° C., as well as materials of a higher glass transition temperature, for example, above 150° C. The choice of material for the flexible plastic substrate would depend on factors such as manufacturing process conditions, such as deposition temperature, and annealing temperature, as well as post-manufacturing conditions such as in a process line of a displays manufacturer. Certain of the plastic substrates discussed below can withstand higher processing temperatures of up to at least about 200° C., some up to 300°-350° C., without damage.

Although the substrate can be transparent, translucent or opaque, for most applications, transparent substrate(s) are preferred. Although various examples of plastic substrates are set forth below, it should be appreciated that the flexible substrate can also be formed from other materials such as flexible glass and ceramic.

Typically, the flexible plastic substrate is a polyester including polyethylene terephthalate (PET), polyethylene naphthalate (PEN), polyester ionomer, polyethersulfone (PES), polycarbonate (PC), polysulfone, a phenolic resin, an epoxy resin, polyester, polyimide, polyetherester, polyetheramide, cellulose nitrate, cellulose acetate, poly(vinyl acetate), polystyrene, polyolefins including polyolefin ionomers, polyamide, aliphatic polyurethanes, polyacrylonitrile, polytetrafluoroethylenes, polyvinylidene fluorides, poly(methyl (x-methacrylates), an aliphatic or cyclic polyolefin, polyarylate (PAR), polyetherimide (PEI), polyethersulphone (PES), polyimide (PI), Teflon poly(perfluoro-alboxy)fluoropolymer (PFA), poly(ether ether ketone) (PEEK), poly(ether ketone) (PEK), poly(ethylene tetrafluoroethylene)fluoropolymer (PETFE), and poly(methyl methacrylate) and various acrylate/methacrylate copolymers (PMMA) natural and synthetic paper, resin-coated or laminated paper, voided polymers including polymeric foam, microvoided polymers and microporous materials, or fabric, or any combinations thereof. Aliphatic polyolefins may include high density polyethylene (HDPE), low density polyethylene (LDPE), and polypropylene, including oriented polypropylene (OPP).

The preferred flexible plastic donor substrates are polyester, polyolefin and cellulose acetate because of their superior mechanical and thermal properties as well as their availability in large quantity at a moderate price.

The most preferred cellulose acetate for use as the donor substrate is cellulose triacetate, also known as triacetylcellulose or TAC. TAC film has traditionally been used by the photographic industry due to its unique physical properties, and flame retardance. TAC film is also the preferred polymer film for use as a cover sheet for polarizers used in liquid crystal displays.

The manufacture of TAC films by a casting process is well known and includes the following process. A TAC solution in organic solvent (dope) is typically cast on a drum or a band, and the solvent is evaporated to form a film. Before casting the dope, the concentration of the dope is typically so adjusted that the solid content of the dope is in the range of 18 to 35 wt. %. The surface of the drum or band is typically polished to give a mirror plane. The casting and drying stages of the solvent cast methods are described in U.S. Pat. Nos. 2,336,310, 2,367,603, 2,492,078, 2,492,977, 2,492,978, 2,607,704, 2,739,069, 2,739,070, British Patent Nos. 640,731, 736,892, Japanese Patent Publication Nos. 45(1970)-4554, 49(1974)-5614, Japanese Patent Provisional Publication Nos. 60(1985)-176834, 60(1985)-203430 and 62(1987)-115035.

A plasticizer can be added to the cellulose acetate film to improve the mechanical strength of the film. The plasticizer has another function of shortening the time for the drying process. Phosphoric esters and carboxylic esters (such as phthalic esters and citric esters) are usually used as the plasticizer. Examples of the phosphoric esters include triphenyl phosphate (TPP) and tricresyl phosphate (TCP). Examples of the phthalic esters include dimethyl phthalate (DMP), diethyl phthalate (DEP), dibutyl phthalate (DBP), dioctyl phthalate (DOP), diphenyl phthalate (DPP) and diethylhexyl phthalate (DEHP). Examples of the citric esters include o-acetyltriethyl citrate (OACTE) and o-acetyltributyl citrate (OACTB). The amount of the plasticizer is in the range of typically 0.1 to 25 wt. %, conveniently 1 to 20 wt. %, desirably 3 to 15 wt. % based on the amount of cellulose acetate.

The particular polyester chosen for use as the donor substrate can be a homo-polyester or a co-polyester, or mixtures thereof as desired. The polyester can be crystalline or amorphous or mixtures thereof as desired. Polyesters are normally prepared by the condensation of an organic dicarboxylic acid and an organic diol and, therefore, illustrative examples of useful polyesters will be described herein below in terms of these diol and dicarboxylic acid precursors.

Preferred polyesters for use in the donor for the practice of this invention include poly(ethylene terephthalate), poly(butylene terephthalate), poly(1,4-cyclohexylene dimethylene terephthalate) and poly(ethylene naphthalate) and copolymers and/or mixtures thereof. Among these polyesters of choice, poly(ethylene terephthalate) is most preferred.

The aforesaid substrate can be planar and/or curved. The curvature of the substrate can be characterized by a radius of curvature, which may have any value. Alternatively, the substrate may be bent so as to form an angle. This angle may be any angle from 0° to 360°, including all angles therebetween and all ranges therebetween. The substrate may be of any thickness, such as, for example, $10^{-8}$ cm to 1 cm including all values in between. The preferred thickness of the substrate varies between 1 to 200 µm, to optimize physical properties and cost. The substrate need not have a uniform thickness. The preferred shape is square or rectangular, although any shape may be used. Before the substrate 12 is coated with the conductive layer 10 it may be physically and/or optically patterned, for example by rubbing, by the application of an image, by the application of patterned electrical contact areas, by the presence of one or more colors in distinct regions, by embossing, microembossing, microreplication, etc.

The aforesaid substrate can comprise a single layer or multiple layers according to need. The multiplicity of layers may include any number of additional layers such as antistatic layers, tie layers or adhesion promoting layers, abrasion resistant layers, curl control layers, conveyance layers, barrier layers, splice providing layers, UV, visible and/or infrared light absorption layers, optical effect providing layers, such as antireflective and antiglare layers, waterproofing layers, adhesive layers, magnetic layers, interlayers, imageable layers and the like.

In the practice of the present invention, the substrate is coated with a silicone layer. The silicone layer is a release layer that facilitates separation of the conductive layer from the donor laminate during the transfer process. The silicone layer comprises an organic material having a Si—O bond in its structure. The flexibility inherent in the Si—O bond and their low surface energy are essential for the silicone's unique release properties. For the purpose of the present invention, the silicon layer preferably has a surface energy of 50 mN/m or less, more preferably 30 mN/m or less, and most preferably 25 mN/m or less, in order to insure facile transfer of the thin conductive layer. Preferably, the silicone layer comprises a silicone polymer. Most preferably, the silicone polymer is crosslinked (also referred to as "cured"). Crosslinking the silicone polymer helps to insure that the release layer is non-migratory (that is, the release material is not transferred with the conductive layer, but rather remains permanently attached to the donor substrate).

Silicone release layers are well known in the field of pressure sensitive adhesive (PSA) coated materials including labels, tapes, sign lettering, floor tiles, etc. Typical silicone release materials that are suitable in the present invention contain dimethyl siloxane groups. Silicone release materials are cured either thermally or using UV or electron beam radiation. Thermal curing is often aided by the presence of a tin or platinum based catalyst. To reduce cure time, the silicone release layers may be coated from silicone modified with epoxy, acrylate, urethane, ester, or other functionality known in the art. Particularly suitable silicone materials are epoxy silanes such as those described in U.S. Pat. No. 5,370,981, because of their effectiveness in small quantity, as well as coatability, commercial availability, and compatibility with polymeric conductors. The silicone layer may be applied from water, solvent, or solvent-less formulations. A wide range of suitable silicone materials are commercially available from Dow Corning Corporation (Syl-Off® series), Rhodia Silicones (SILCOLEASE® series), General Electric Co. (GE Silicones), Genesee Polymers Corp. (EXP® series), Degussa Corp., and others.

The silicone layer is applied at a dried coating coverage of about 10 to 5000 mg/m². Preferably, the dried coating coverage is 10 to 1000 mg/m². The silicone layer may be applied by any known coating methods such as spray coating, gravure coating, air knife coating, blade coating, rod coating, hopper coating, and others.

The silicone may comprise various additives to improve performance such as coatability, release or physical properties. Suitable additives include surfactants and coating aids, crosslinking agents, catalysts, antistatic agents, inhibitors, release modifiers, adhesion modifiers, rheology modifiers, UV absorbers, photoinitiators, and others.

The polymer substrate can be formed by any method known in the art such as those involving extrusion, coextrusion, quenching, orientation, heat setting, lamination, coating and solvent casting. The substrate can be an oriented sheet formed by any suitable method known in the art, such as by a flat sheet process or a bubble or tubular process. The flat sheet process involves extruding or coextruding the materials of the sheet through a slit die and rapidly quenching the extruded or coextruded web upon a chilled casting drum so that the polymeric component(s) of the sheet are quenched below their solidification temperature. Alternatively, the sheet can be formed by casting a solution of the sheet material on a drum or band and evaporating the solvent.

The sheet thus formed is then oriented by stretching uniaxially or biaxially in mutually perpendicular directions at a temperature above the glass transition temperature of the polymer(s). The sheet may be stretched in one direction and then in a second direction or may be simultaneously stretched in both directions. The preferred stretch ratio in any direction is at least 3:1. After the sheet has been stretched, it can be heat set by heating to a temperature sufficient to crystallize the polymers while restraining to some degree the sheet against retraction in both directions of stretching.

The substrate polymer sheet may be subjected to any number of coatings and treatments, after casting, extrusion, coextrusion, orientation, etc. or between casting and full orientation, to improve and/or optimize its properties, such as printability, barrier properties, heat-sealability, spliceability, adhesion to other substrates and/or imaging layers. Examples of such coatings can be acrylic coatings for printability, polyvinylidene halide for heat seal properties, etc. Examples of such treatments can be flame, plasma and corona discharge treatment, ultraviolet radiation treatment, ozone treatment, electron beam treatment, acid treatment, alkali treatment, saponification treatment to improve and/or optimize any property, such as coatability and adhesion. Further examples of treatments can be calendaring, embossing and patterning to obtain specific effects on the surface of the web. The polymer sheet can be further incorporated in any other suitable substrate by coating, lamination, adhesion, cold or heat sealing, extrusion, co-extrusion, or any other method known in the art.

The conductive layer of the invention can comprise any of the known electronically conductive polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408) and substituted or unsubstituted aniline-containing polymers (as mentioned in U.S. Pat. Nos. 5,716,550, 5,093,439, and 4,070,189). However, particularly suitable are those, which comprise an electronically conductive polymer in its cationic form and a polyanion, since such a combination can be formulated in aqueous medium and hence environmentally desirable. Examples of such polymers are disclosed in U.S. Pat. Nos. 5,665,498 and 5,674,654 for pyrrole-containing polymers and U.S. Pat. No. 5,300,575 for thiophene-containing polymers. Among these, the thiophene-containing polymers are most preferred because of their light and heat stability, dispersion stability and ease of storage and handling.

Preparation of the aforementioned thiophene based polymers has been discussed in detail in a publication titled "Poly (3,4-ethylenedioxythiophene) and its derivatives: past, present and future" by L. B. Groenendaal, F. Jonas, D. Freitag, H. Pielartzik and J. R. Reynolds in Advanced Materials, (2000), 12, No. 7, pp. 481-494, and references therein.

In a preferred embodiment, the layer containing the electronically conductive polymer is prepared by applying a mixture comprising:

a) a polythiophene according to Formula I

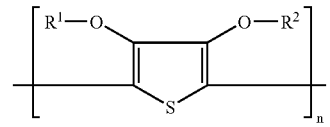

in a cationic form, wherein each of R1 and R2 independently represents hydrogen or a C1-4 alkyl group or together represent an optionally substituted C1-4 alkylene group or a cycloalkylene group, preferably an ethylene group, an optionally alkyl-substituted methylene group, an optionally C1-12 alkyl- or phenyl-substituted 1,2-ethylene group, a 1,3-propylene group or a 1,2-cyclohexylene group; and n is 3 to 1000;

and b) a polyanion compound;

It is preferred that the electronically conductive polymer and polyanion combination is soluble or dispersible in organic solvents or water or mixtures thereof. For environmental reasons, aqueous systems are preferred. Polyanions used with these electronically conductive polymers include the anions of polymeric carboxylic acids such as polyacrylic acids, poly(methacrylic acid), and poly(maleic acid), and polymeric sulfonic acids such as polystyrenesulfonic acids and polyvinylsulfonic acids, the polymeric sulfonic acids being preferred for use in this invention because of its stability and availability in large scale. These polycarboxylic and polysulfonic acids may also be copolymers formed from vinylcarboxylic and vinylsulfonic acid monomers copolymerized with other polymerizable monomers such as the esters of acrylic acid and styrene. The molecular weight of the polyacids providing the polyanions preferably is 1,000 to 2,000,000 and more preferably 2,000 to 500,000. The polyacids or their alkali salts are commonly available, for example as polystyrenesulfonic acids and polyacrylic acids, or they may be produced using known methods. Instead of the free acids required for the formation of the electrically conducting polymers and polyanions, mixtures of alkali salts of polyacids and appropriate amounts of monoacids may also be used. The polythiophene to polyanion weight ratio can widely vary between 1:99 to 99:1, however, optimum properties such as high electrical conductivity and dispersion stability and coatability are obtained between 85:15 and 15:85, and more preferably between 50:50 and 15:85. The most preferred electronically conductive polymers include poly(3,4-ethylene dioxythiophene styrene sulfonate) which comprises poly(3,4-ethylene dioxythiophene) in a cationic form and polystyrenesulfonic acid.

Desirable results such as enhanced conductivity of the conductive layer can be accomplished by incorporating a conductivity enhancing agent (CEA). Preferred CEAs are organic compounds containing dihydroxy, poly-hydroxy, carboxyl, amide, or lactam groups, such as (1) those represented by the following Formula II:

$$(OH)_n\text{—}R\text{—}(COX)_m \qquad II$$

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or (2) a sugar, sugar derivative, polyalkylene glycol, or glycerol compound; or (3) those selected from the group consisting of N-methylpyrrolidone, pyrrolidone, caprolactam, N-methyl caprolactam, dimethyl sulfoxide or N-octylpyrrolidone; or (4) a combination of the above.

Particularly preferred conductivity enhancing agents are: sugar and sugar derivatives such as sucrose, glucose, fructose, lactose; sugar alcohols such as sorbitol, mannitol; furan derivatives such as 2-furancarboxylic acid, 3-furancarboxylic acid; alcohols such as ethylene glycol, glycerol, di- or triethylene glycol. Most preferred conductivity enhancing agents are ethylene glycol, glycerol, di- or triethylene glycol, as they provide maximum conductivity enhancement.

The CEA can be incorporated by any suitable method. Preferably the CEA is added to the coating composition comprising the electronically conductive polymer and the polyanion. Alternatively, the coated and dried conductive layer can be exposed to the CEA by any suitable method, such as a post-coating wash.

The concentration of the CEA in the coating composition may vary widely depending on the particular organic compound used and the conductivity requirements. However, convenient concentrations that may be effectively employed in the practice of the present invention are about 0.5 to about 25 weight %; more conveniently 0.5 to 10 and more desirably 0.5 to 5.

The conductive layer of the invention can be formed by any method known in the art. Particularly preferred methods include coating from a suitable coating composition by any well known coating method such as air knife coating, gravure coating, hopper coating, curtain coating, roller coating, spray coating, electrochemical coating, inkjet printing, flexographic printing, stamping, and the like.

While the conductive layer can be formed without the addition of a film-forming polymeric binder, a film-forming binder can be employed to improve the physical properties of the layer. In such an embodiment, the layer may comprise from about 1 to 95% of the film-forming polymeric binder. However, the presence of the film forming binder may increase the overall surface electrical resistivity of the layer. The optimum weight percent of the film-forming polymer binder varies depending on the electrical properties of the electronically conductive polymer, the chemical composition of the polymeric binder, and the requirements for the particular circuit application.

Polymeric film-forming binders useful in the conductive layer of this invention can include, but are not limited to, water-soluble or water-dispersible hydrophilic polymers such as gelatin, gelatin derivatives, maleic acid or maleic anhydride copolymers, polystyrene sulfonates, cellulose derivatives (such as carboxymethyl cellulose, hydroxyethyl cellulose, cellulose acetate butyrate, diacetyl cellulose, and triacetyl cellulose), polyethylene oxide, polyvinyl alcohol, and poly-N-vinylpyrrolidone. Other suitable binders include aqueous emulsions of addition-type homopolymers and copolymers prepared from ethylenically unsaturated monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes and polyesterionomers.

Other ingredients that may be included in the conductive layer include but are not limited to surfactants, defoamers or coating aids, charge control agents, thickeners or viscosity modifiers, antiblocking agents, coalescing aids, crosslinking agents or hardeners, soluble and/or solid particle dyes, matte beads, inorganic or polymeric particles, adhesion promoting agents, bite solvents or chemical etchants, lubricants, plasticizers, antioxidants, colorants or tints, and other addenda that are well-known in the art. Preferred bite solvents can include any of the volatile aromatic compounds disclosed in U.S. Pat. No. 5,709,984, as "conductivity-increasing" aromatic compounds, comprising an aromatic ring substituted with at least one hydroxy group or a hydroxy substituted substituents group. These compounds include phenol, 4-chloro-3-methyl phenol, 4-chlorophenol, 2-cyanophenol, 2,6-dichlorophenol, 2-ethylphenol, resorcinol, benzyl alcohol, 3-phenyl-1-propanol, 4-methoxyphenol, 1,2-catechol, 2,4-dihydroxytoluene, 4-chloro-2-methyl phenol, 2,4-dinitrophenol, 4-chlororesorcinol, 1-naphthol, 1,3-naphthalenediol and the like. These bite solvents are particularly suitable for polyester based polymer sheets of the invention. Of this group, the most preferred compounds are resorcinol and 4-chloro-3-methyl phenol. Preferred surfactants suitable for these coatings include nonionic and anionic surfactants. Preferred crosslinking agents suitable for these coatings include silane compounds, more preferably epoxy silane. Suitable silane compounds are disclosed in U.S. Pat. No. 5,370,981.

The conductive layer of the invention should contain about 1 to about 1000 mg/m$^2$ dry coating weight of the electronically conductive polymer. Preferably, the conductive layer should contain about 5 to about 500 mg/m$^2$ dry coating weight of the electronically conductive polymer. The actual dry coating weight of the conductive polymer applied is determined by the properties of the particular conductive polymer employed and by the requirements of the particular application. These requirements include conductivity, transparency, optical density and cost for the layer.

For some specific display applications, such as those involving organic or polymeric light emitting diodes the surface roughness of the conductive layer can be critical. Typically, a very smooth surface, with low roughness (Ra, roughness average) is desired for maximizing optical and barrier properties of the coated substrate. Preferred Ra values for the conductive layer of the invention, particularly after its transfer to a receiver, is less than 1000 nm, more preferably less than 100 nm, and most preferably less than 20 nm. However, it is to be understood that if for some application a rougher surface is required higher Ra values can be attained within the scope of this invention, by any means known in the art.

A key criterion of the conductive layer of the invention involves two important characteristics: transparency and surface electrical resistance. The stringent requirement of high transparency and low SER demanded by modem display devices can be extremely difficult to attain with electronically conductive polymers. Typically, lower surface electrical resistance values are obtained by coating relatively thick layers which undesirably reduces transparency. Additionally, even the same general class of conductive polymers, such as polythiophene containing polymers, may result in different SER and transparency characteristics, based on differences in molecular weight, impurity content, doping level, morphology and the like.

It is found during the course of this invention that a figure of merit (FOM) can be assigned to the conductive layer. Such FOM values are determined by (1) measuring the visual light transmission (T) and the surface electrical resistance (SER) of the conductive layer at various thickness values of the layer, (2) plotting these data in a ln (1/T) vs. 1/SER space, and (3) then determining the slope of a straight line best fitting these data points and passing through the origin of such a plot. It is found that ln (1/T) vs. 1/SER plots for electronically conductive polymer layers, particularly those comprising polythiophene in a cationic form with a polyanion compound, generate a linear relationship, preferably one passing through the origin, wherein the slope of such a linear plot is the FOM of the electronically conductive polymer layer. It is also found that lower the FOM value, more desirable is the electrical and optical characteristics of the electronically conductive polymer layer; namely, lower the FOM, lower is the SER and higher is the transparency of the conductive layer. For the instant invention, electronically conductive polymer layers of FOM values <150, preferably ≦100, and more preferably ≦50 are most desired, particularly for display applications.

Visual light transmission value T is determined from the total optical density at 530 nm, after correcting for the contributions of the uncoated substrate. A Model 361T X-Rite densitometer measuring total optical density at 530 nm, is best suited for this measurement.

Visual light transmission, T, is related to the corrected total optical density at 530 nm, o.d.(corrected), by the following expression, $$T=1/(10^{o.d.(corrected)})$$

The SER value is typically determined by a standard four-point electrical probe.

The SER value of the electronically conductive polymer layer of the invention can vary according to need. For use as an electrode in a display device, the SER is typically less than 10000 ohms/square, preferably less than 5000 ohms/square, and more preferably less than 1000 ohms/square and most preferably less than 500 ohms/square, as per the current invention.

The transparency of the conductive layer of the invention can vary according to need. For use as an electrode in a display device, the conductive layer is desired to be highly transparent. Accordingly, the visual light transmission value T for the conductive layer of the invention is preferably ≧65%, more preferably ≧80%, and most preferably ≧90% for best display device performance.

The conductive layer need not form an integral whole, need not have a uniform thickness and need not be continuous. However, in accordance with the invention, the conductive layer is contiguous to the substrate of the donor laminate.

Figure 2:
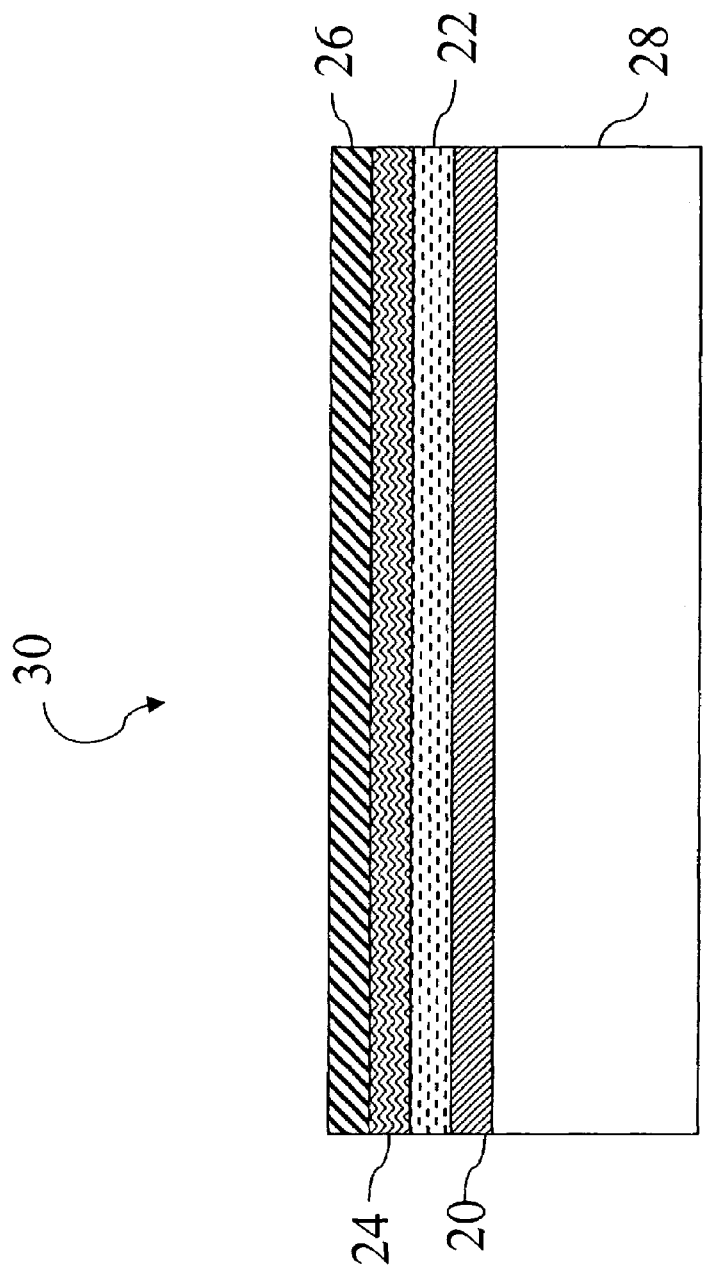
FIG. 2 shows a cross-sectional representation of a donor laminate of the invention comprising a substrate, a silicone layer, a conductive layer, and two other layers disposed on the conductive layer.

Turning now to FIG. 2 which shows a cross-sectional representation of a donor laminate 30 of the invention comprising a substrate 28, a silicone layer 20, a conductive layer 22 in contact with the said silicone layer 20, and two other layers 24 and 26 disposed on the conductive layer 22. Layers 24 and 26 can be any combination of operational layers or auxiliary layers. Examples of operational layers include layers that act as dielectric, conducting, semiconducting, superconducting, waveguiding, frequency multiplying, imageable, light producing (e.g., luminescing, light emitting, fluorescing or phosphorescing), electron producing, hole producing, magnetic, light absorbing, reflecting, diffracting, phase retarding, scattering, dispersing, refracting, polarizing, or diffusing layers in the device and/or layers that produce an optical or electronic gain in the device.

Auxiliary layers include layers that do not perform a function in the operation of the device, but are provided solely, for example, to facilitate transfer of a layer to a receiver element, to protect layers of the device from damage and/or contact with outside elements, and/or to adhere the transferred layer to the receiver element. Specific examples of auxiliary layers include: antistatic layers, tie layers or adhesion promoting layers, abrasion resistant layers, curl control layers, conveyance layers, barrier layers, splice providing layers, UV, visible and/or infrared light absorption layers, optical effect providing layers, such as antireflective and antiglare layers, waterproofing layers, adhesive layers, magnetic layers, interlayers and the like.

In the donor laminate illustrated in FIG. 2, for example, layer 24 could be a dielectric layer and layer 26 could be an adhesive layer that facilitates the transfer of conductive layer 22 and dielectric layer 24 to a receiver element.

It should be obvious to one skilled in the art that a wide variety of donor laminate configurations employing various combinations of operational layers and auxiliary layers may be constructed depending on the type of device that is being constructed and the transfer means being employed.

An active or passive device can be formed, at least in part, by the transfer of at least a conductive layer from a donor laminate comprising a substrate and conductive layer comprising an electronically conductive polymer and a polyanion, in contact with said substrate, by bringing the side of said laminate bearing said conductive layer into contact with a receiver element, applying heat, pressure, or heat and pressure, and separating the said substrate from the receiver element. In at least some instances, pressure or vacuum are used to hold the transfer laminate in intimate contact with the receiver element.

The donor laminate can be heated by application of directed heat on a selected portion of the donor laminate. Heat can be generated using a heating element (e.g., a resistive heating element), converting radiation (e.g., a beam of light) to heat, and/or applying an electrical current to a layer of the donor laminate to generate heat. In many instances, thermal transfer using light from, for example, a lamp or laser, is advantageous because of the accuracy and precision that can often be achieved. The size and shape of the transferred pattern (a pattern is defined as an arrangement of lines and shapes, e.g., a line, circle, square, or other shape) can be controlled by, for example, selecting the size of the light beam, the exposure pattern of the light beam, the duration of directed beam contact with the donor laminate, and the materials of the thermal transfer element.

Suitable lasers include, for example, high power (>100 mW) single mode laser diodes, fiber-coupled laser diodes, and diode-pumped solid state lasers (e.g., Nd:YAG and Nd:YLF). Laser exposure dwell times can be in the range from, for example, about 0.1 to 100 microseconds and laser fluences can be in the range from, for example, about 0.01 to about 1 $J/cm^2$.

When high spot placement accuracy is required (e.g. for high information full color display applications) over large substrate areas, a laser is particularly useful as the radiation source. Laser sources are compatible with both large rigid substrates such as 1 m×1 m×1.1 mm glass, and continuous or sheeted film substrates, such as 100 μm polyimide sheets.

For laser transfer, the donor laminate is typically brought into intimate contact with a receiver. In at least some instances, pressure or vacuum are used to hold the donor laminate in intimate contact with the receiver. A laser source is then used in an imagewise fashion (e.g., digitally or by analog exposure through a mask) to perform imagewise transfer of materials from the donor laminate to the receiver according to any pattern. In operation, a laser can be rastered or otherwise moved across the donor laminate and the receiver, the laser being selectively operated to illuminate portions of the donor laminate according to a desired pattern. Alternatively, the laser may be stationary and the donor laminate and receiver moved beneath the laser.

Alternatively, a heating element, such as a resistive heating element, may be used to affect the transfer. Typically, the donor laminate is selectively contacted with the heating element to cause thermal transfer of at least the conductive layer according to a pattern. In another embodiment, the donor laminate may include a layer that can convert an electrical current applied to the donor into heat.

Resistive thermal print heads or arrays may be particularly useful with smaller substrate sizes (e.g., less than approximately 30 cm in any dimension) or for larger patterns, such as those required for alphanumeric segmented displays.

Pressure can be applied during the transfer operation using either mechanically or acoustically generated force. Mechanical force may be generated by a variety of means well known in the art, for example, by contacting the donor laminate and receiver element between opposing nip rollers. The nip rollers may be smooth or one or both rollers may have an embossed pattern. Alternatively, the mechanical force may be generated by the action of a stylus upon either the donor laminate or receiver element when they are in intimate contact. The donor and receiver may be contacted in a stamping press using either smooth or patterned platens. Another means of applying mechanical force include the use of acoustic force. Acoustic force may be generated using a device similar to that disclosed in U.S. Patent Application Publication 2001/0018851 wherein a transducer passes acoustic energy through an acoustic lens which in turn focuses its received acoustic energy into a small focal area of the donor laminate when it is in intimate contact with the receiver element.

Peel force for separation of the conductive layer from the donor laminate substrate is an important consideration as that plays a role in the transfer process. Peel force for separation of the conductive layer from the donor laminate substrate is determined using an IMASS SP-2000 Peel Tester. In this testing, the conductive layer on the donor laminate substrate is lightly scored with a razor knife. A 2 inch wide Permacel tape is next applied with a 5 lb roller over the sample, over the razor knife cut. Strips of 1 inch×6 inch of the sample and tape composite thus prepared, are next subjected to a 180° peel force. The tape is peeled back at 180° with the conductive layer bonded to it, at 12 ft/min using a 5 kilograms load cell in the IMASS SP-2000 Peel Tester. The average peel force measured in g/inch is reported as the peel force for separation of the conductive layer from the donor laminate substrate.

For the purpose of the invention, it is preferred that the peel force for separation of the conductive layer from the donor laminate substrate is <100 g/inch, more preferably, <50 g/inch, at room temperature and/or at the transfer temperature, the temperature at which the conductive layer is transferred from the donor laminate to the receiver. Depending on the choice of substrate for the donor laminate and the receiver and the method of transfer, it is also desirable that the peel force for separation of the conductive layer from the donor laminate substrate is <100 g/inch, more preferably, <50 g/inch, at elevated temperatures up to 300° C. in order to maintain optimum film integrity during transfer.

To facilitate the transfer process, the surface of the donor laminate in contact with the receiver element may be an adhesive layer. Alternatively, the surface of the receiver element in contact with a donor laminate may be an adhesive layer. The adhesive layer may be a pressure sensitive adhesive layer comprising a low Tg polymer, a heat activated adhesive layer comprising a thermoplastic polymer, or a thermally or radiation curable adhesive layer. Examples of suitable polymers for use in the adhesive layer include acrylic polymers, styrenic polymers, polyolefins, polyurethanes, and other polymers well known in the adhesives industry.

The donor laminates and transfer process of the invention is useful, for example, to reduce or eliminate wet processing steps of processes such as photolithographic patterning which is used to form many electronic and optical devices. In addition, laser thermal transfer can often provide better accuracy and quality control for very small devices, such as small optical and electronic devices, including, for example, transistors and other components of integrated circuits, as well as components for use in a display, such as electroluminescent lamps and control circuitry. Moreover, laser thermal transfer may, at least in some instances, provide for better registration when forming multiple devices over an area that is large compared to the device size. As an example, components of a display, which has many pixels, can be formed using this method.

In some instances, multiple donor laminates may be used to form a device or other object. The multiple donor laminates may include donor laminates having two or more layers and donor laminates that transfer a single layer.

For example, one donor laminate may be used to form a gate electrode of a field effect transistor and another donor laminate may be used to form the gate insulating layer and semiconducting layer, and yet another donor laminate may be used to form the source and drain contacts. A variety of other combinations of two or more donor laminates can be used to form a device, each donor laminates forming one or more layers of the device.

The receiver substrate may be any substrate described herein above for the donor laminate substrate. Suitable items for a particular application include, but not limited to, transparent films, display black matrices, passive and active portions of electronic displays, metals, semiconductors, glass, various papers, and plastics. Non-limiting examples of receiver substrates which can be used in the present invention include anodized aluminum and other metals, plastic films (e.g., polyethylene terephthalate, polypropylene), indium tin oxide coated plastic films, glass, indium tin oxide coated glass, flexible circuitry, circuit boards, silicon or other semiconductors, and a variety of different types of paper (e.g., filled or unfilled, calendered, or coated), textile, woven or non-woven polymers. Various layers (e.g., an adhesive layer) may be coated onto the receiver substrate to facilitate transfer of the transfer layer to the receiver substrate. Other layers may be coated on the receiver substrate to form a portion of a multilayer device.

In a particularly preferred embodiment, the receiver substrate forms at least a portion of a device, most preferably a display device. The display device typically comprises at least one imageable layer wherein the imageable layer can contain an electrically imageable material. The electrically imageable material can be light emitting or light modulating. Light emitting materials can be inorganic or organic in nature. Particularly preferred are organic light emitting diodes (OLED) or polymeric light emitting diodes (PLED). The light modulating material can be reflective or transmissive. Light modulating materials can be electrochemical, electrophoretic, such as Gyricon particles, electrochromic, or liquid crystals. The liquid crystalline material can be twisted nematic (TN), super-twisted nematic (STN), ferroelectric, magnetic, or chiral nematic liquid crystals. Especially preferred are chiral nematic liquid crystals. The chiral nematic liquid crystals can be polymer dispersed liquid crystals (PDLC). Structures having stacked imaging layers or multiple substrate layers, however, are optional for providing additional advantages in some case.

Figure 3:
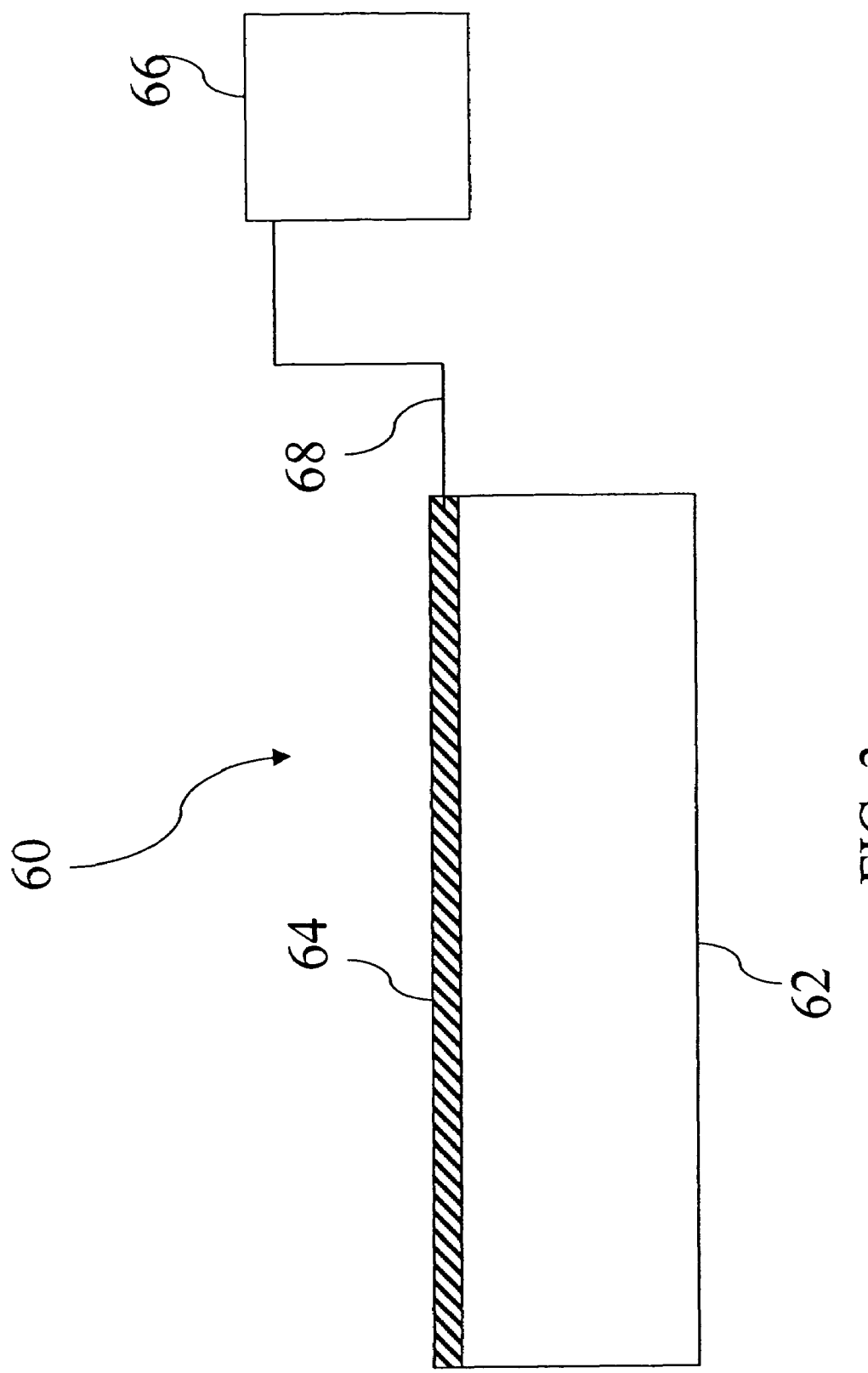
FIG. 3 shows a schematic of a display component formed by the methods of the invention comprising a receiver element having a conductive layer connected to a power source by an electric lead.

After transferring the conductive layer and any other operational or auxiliary layers, the conductive layer may simply be incorporated in a device as any one or more conducting electrodes present in such prior art devices. In some such cases the conductive layer preferably has at least one electric lead attached to (in contact with) it for the application of current, voltage, etc. (i.e. electrically connected). The lead(s) is/are preferably not in electrical contact with the substrate and may be made of patterned deposited metal, conductive or semiconductive material, such as ITO, may be a simple wire in contact with the conducting polymer, and/or conductive paint comprising, for example, a conductive polymer, carbon, and/or metal particles. Devices according to the invention preferably also include a current or a voltage source electrically connected to the conducting electrode through the lead(s). A power source, battery, etc. may be used. One embodiment of the invention is illustrated in FIG. 3 as a display component 60, wherein an electronically conductive polymer layer 64 has been transferred, as per invention, from a donor (not shown) on to a receiver substrate 62, and is connected to a power source 66 by means of an electric lead 68. In addition to or alternative to functioning as an electrode, the transfer layer of the invention can form any other operational and/or non-operational layer in any device.

In a preferred embodiment, the electrically imageable material can be addressed with an electric field and then retain its image after the electric field is removed, a property typically referred to as "bistable". Particularly suitable electrically imageable materials that exhibit "bistability" are electrochemical, electrophoretic, such as Gyricon particles, electrochromic, magnetic, or chiral nematic liquid crystals. Especially preferred are chiral nematic liquid crystals. The chiral nematic liquid crystals can be polymer dispersed liquid crystals (PDLC).

For purpose of illustration of the application of the present invention, the display will be described primarily as a liquid crystal display. However, it is envisioned that the present invention may find utility in a number of other display applications.

Figure 4:
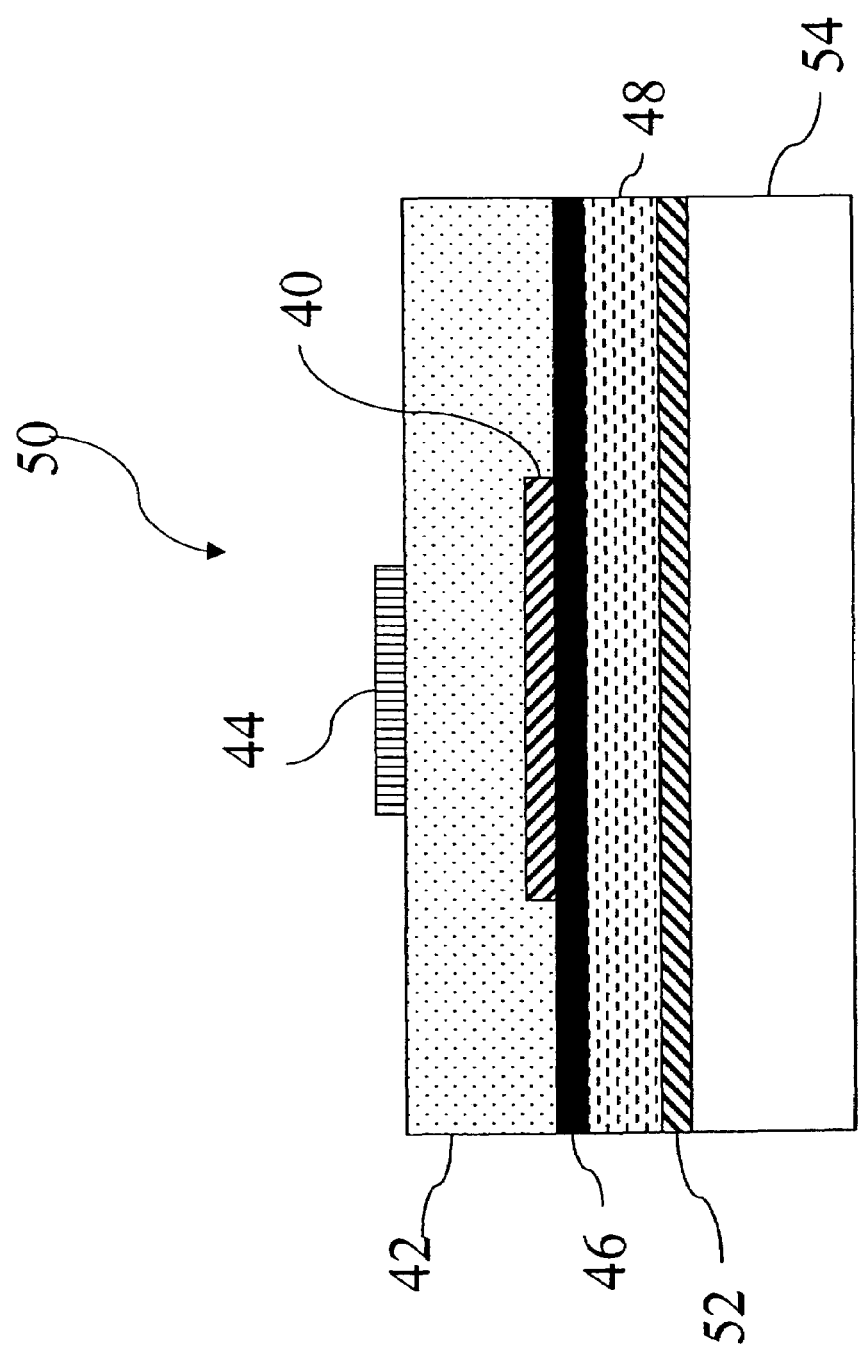
FIG. 4 shows a schematic of a polymer dispersed LC display formed by the methods of the invention.

As used herein, a "liquid crystal display" (LCD) is a type of flat panel display used in various electronic devices. At a minimum, an LCD comprises a substrate, at least one conductive layer and a liquid crystal layer. LCDs may also comprise two sheets of polarizing material with a liquid crystal solution between the polarizing sheets. The sheets of polarizing material may comprise a substrate of glass or transparent plastic. The LCD may also include functional layers. In one embodiment of an LCD item 50, illustrated in FIG. 4, a transparent, multilayer flexible substrate 54 has a first conductive layer 52, which may be patterned, onto which is coated the light-modulating liquid crystal layer 48. A second conductive layer 40 is applied and overcoated with a dielectric layer 42 to which dielectric conductive row contacts 44 are attached, including vias (not shown) that permit interconnection between conductive layers and the dielectric conductive row contacts. An optional nanopigmented layer 46 is applied between the liquid crystal layer 48 and the second conductive layer 40. In a typical matrix-address light-emitting display device, numerous light-emitting devices are formed on a single substrate and arranged in groups in a regular grid pattern. Activation may be by rows and columns.

The liquid crystal (LC) is used as an optical switch. The substrates are usually manufactured with transparent, conductive electrodes, in which electrical "driving" signals are coupled. The driving signals induce an electric field which can cause a phase change or state change in the LC material, the LC exhibiting different light-reflecting characteristics according to its phase and/or state.

Liquid crystals can be nematic (N), chiral nematic (N*), or smectic, depending upon the arrangement of the molecules in the mesophase. Chiral nematic liquid crystal (N*LC) displays are typically reflective, that is, no backlight is needed, and can function without the use of polarizing films or a color filter.

Chiral nematic liquid crystal refers to the type of liquid crystal having finer pitch than that of twisted nematic and super-twisted nematic used in commonly encountered LC devices. Chiral nematic liquid crystals are so named because such liquid crystal formulations are commonly obtained by adding chiral agents to host nematic liquid crystals. Chiral nematic liquid crystals may be used to produce bi-stable or multi-stable displays. These devices have significantly reduced power consumption due to their non-volatile "memory" characteristic. Since such displays do not require a continuous driving circuit to maintain an image, they consume significantly reduced power. Chiral nematic displays are bistable in the absence of a field; the two stable textures are the reflective planar texture and the weakly scattering focal conic texture. In the planar texture, the helical axes of the chiral nematic liquid crystal molecules are substantially perpendicular to the substrate upon which the liquid crystal is disposed. In the focal conic state the helical axes of the liquid crystal molecules are generally randomly oriented. Adjusting the concentration of chiral dopants in the chiral nematic material modulates the pitch length of the mesophase and, thus, the wavelength of radiation reflected. Chiral nematic materials that reflect infrared radiation and ultraviolet have been used for purposes of scientific study. Commercial displays are most often fabricated from chiral nematic materials that reflect visible light. Some known LCD devices include chemically-etched, transparent, conductive layers overlying a glass substrate as described in U.S. Pat. No. 5, 667,853, incorporated herein by reference.

In one embodiment, a chiral-nematic liquid crystal composition may be dispersed in a continuous matrix. Such materials are referred to as "polymer-dispersed liquid crystal" materials or "PDLC" materials. Such materials can be made by a variety of methods. For example, Doane et al. (Applied Physics Letters, 48, 269 (1986)) disclose a PDLC comprising approximately 0.4 µm droplets of nematic liquid crystal 5CB in a polymer binder. A phase separation method is used for preparing the PDLC. A solution containing monomer and liquid crystal is filled in a display cell and the material is then polymerized. Upon polymerization the liquid crystal becomes immiscible and nucleates to form droplets. West et al. (Applied Physics Letters 63, 1471 (1993)) disclose a PDLC comprising a chiral nematic mixture in a polymer binder. Once again a phase separation method is used for preparing the PDLC. The liquid-crystal material and polymer (a hydroxy functionalized polymethylmethacrylate) along with a cross-linker for the polymer are dissolved in a common organic solvent toluene and coated on a transparent conductive layer on a substrate. A dispersion of the liquid-crystal material in the polymer binder is formed upon evaporation of toluene at high temperature. The phase separation methods of Doane et al. and West et al. require the use of organic solvents that may be objectionable in certain manufacturing environments.

The contrast of the display is degraded if there is more than a substantial monolayer of N*LC domains. The term "substantial monolayer" is defined by the Applicants to mean that, in a direction perpendicular to the plane of the display, there is no more than a single layer of domains sandwiched between the electrodes at most points of the display (or the imaging layer), preferably at 75 percent or more of the points (or area) of the display, most preferably at 90 percent or more of the points (or area) of the display. In other words, at most, only a minor portion (preferably less than 10 percent) of the points (or area) of the display has more than a single domain (two or more domains) between the electrodes in a direction perpendicular to the plane of the display, compared to the amount of points (or area) of the display at which there is only a single domain between the electrodes.

The amount of material needed for a monolayer can be accurately determined by calculation based on individual domain size, assuming a fully closed packed arrangement of domains. (In practice, there may be imperfections in which gaps occur and some unevenness due to overlapping droplets or domains.) On this basis, the calculated amount is preferably less than about 150 percent of the amount needed for monolayer domain coverage, preferably not more than about 125 percent of the amount needed for a monolayer domain coverage, more preferably not more than 110 percent of the amount needed for a monolayer of domains. Furthermore, improved viewing angle and broadband features may be obtained by appropriate choice of differently doped domains based on the geometry of the coated droplet and the Bragg reflection condition.

In a preferred embodiment of the invention, the display device or display sheet has simply a single imaging layer of liquid crystal material along a line perpendicular to the face of the display, preferably a single layer coated on a flexible substrate. Such as structure, as compared to vertically stacked imaging layers each between opposing substrates, is especially advantageous for monochrome shelf labels and the like. Structures having stacked imaging layers, however, are optional for providing additional advantages in some case.

Preferably, the domains are flattened spheres and have on average a thickness substantially less than their length, preferably at least 50% less. More preferably, the domains on average have a thickness (depth) to length ratio of 1:2 to 1:6.

The flattening of the domains can be achieved by proper formulation and sufficiently rapid drying of the coating. The domains preferably have an average diameter of 2 to 30 microns. The imaging layer preferably has a thickness of 10 to 150 microns when first coated and 2 to 20 microns when dried. The flattened domains of liquid crystal material can be defined as having a major axis and a minor axis. In a preferred embodiment of a display or display sheet, the major axis is larger in size than the cell (or imaging layer) thickness for a majority of the domains. Such a dimensional relationship is shown in U.S. Pat. No. 6,061,107.

Modem chiral nematic liquid crystal materials usually include at least one nematic host combined with a chiral dopant. In general, the nematic liquid crystal phase is composed of one or more mesogenic components combined to provide useful composite properties. Many such materials are available commercially. The nematic component of the chiral nematic liquid crystal mixture may be comprised of any suitable nematic liquid crystal mixture or composition having appropriate liquid crystal characteristics. Nematic liquid crystals suitable for use in the present invention are preferably composed of compounds of low molecular weight selected from nematic or nematogenic substances, for example from the known classes of the azoxybenzenes, benzylideneanilines, biphenyls, terphenyls, phenyl or cyclohexyl benzoates, phenyl or cyclohexyl esters of cyclohexanecarboxylic acid; phenyl or cyclohexyl esters of cyclohexylbenzoic acid; phenyl or cyclohexyl esters of cyclohexylcyclohexanecarboxylic acid; cyclohexylphenyl esters of benzoic acid, of cyclohexanecarboxylic acid and of cyclohexylcyclohexanecarboxylic acid; phenyl cyclohexanes; cyclohexylbiphenyls; phenyl cyclohexylcyclohexanes; cyclohexylcyclohexanes; cyclohexylcyclohexenes; cyclohexylcyclohexylcyclohexenes; 1,4-bis-cyclohexylbenzenes; 4,4-bis-cyclohexylbiphenyls; phenyl- or cyclohexylpyrimidines; phenyl- or cyclohexylpyridines; phenyl- or cyclohexylpyridazines; phenyl- or cyclohexyldioxanes; phenyl- or cyclohexyl-1,3-dithianes; 1,2-diphenylethanes; 1,2-dicyclohexylethanes; 1-phenyl-2-cyclohexylethanes; 1-cyclohexyl-2-(4-phenylcyclohexyl)ethanes; 1-cyclohexyl-2',2-biphenylethanes; 1-phenyl-2-cyclohexylphenylethanes; optionally halogenated stilbenes; benzyl phenyl ethers; tolanes; substituted cinnamic acids and esters; and further classes of nematic or nematogenic substances. The 1,4-phenylene groups in these compounds may also be laterally mono- or difluorinated. The liquid crystalline material of this preferred embodiment is based on the achiral compounds of this type. The most important compounds, that are possible as components of these liquid crystalline materials, can be characterized by the following formula R'—X—Y-Z-R" wherein X and Z, which may be identical or different, are in each case, independently from one another, a bivalent radical from the group formed by -Phe-, -Cyc-, -Phe-Phe-, -Phe-Cyc-, -Cyc-Cyc-, -Pyr-, -Dio-, —B-Phe- and —B-Cyc-; wherein Phe is unsubstituted or fluorine-substituted 1,4-phenylene, Cyc is trans-1,4-cyclohexylene or 1,4-cyclohexenylene, Pyr is pyrimidine-2,5-diyl or pyridine-2,5-diyl, Dio is 1,3-dioxane-2,5-diyl, and B is 2-(trans-1,4-cyclohexyl)ethyl, pyrimidine-2,5-diyl, pyridine-2,5-diyl or 1,3-dioxane-2,5-diyl. Y in these compounds is selected from the following bivalent groups —CH=CH—, —C≡C—, —N=N(O)—, —CH=CY'—, —CH=N(O)—, —CH2—CH2—, —CO—O—, —CH2—O—, —CO—S—, —CH2—S—, —COO-Phe-COO— or a single bond, with Y' being halogen, preferably chlorine, or —CN; R' and R" are, in each case, independently of one another, alkyl, alkenyl, alkoxy, alkenyloxy, alkanoyloxy, alkoxycarbonyl or alkoxycarbonyloxy with 1 to 18, preferably 1 to 12 C atoms, or alternatively one of R' and R" is —F, —CF3, —OCF3, —Cl, —NCS or —CN. In most of these compounds R' and R' are, in each case, independently of each another, alkyl, alkenyl or alkoxy with different chain length, wherein the sum of C atoms in nematic media generally is between 2 and 9, preferably between 2 and 7. The nematic liquid crystal phases typically consist of 2 to 20, preferably 2 to 15 components. The above list of materials is not intended to be exhaustive or limiting. The lists disclose a variety of representative materials suitable for use or mixtures, which comprise the active element in electro-optic liquid crystal compositions.

Suitable chiral nematic liquid crystal compositions preferably have a positive dielectric anisotropy and include chiral material in an amount effective to form focal conic and twisted planar textures. Chiral nematic liquid crystal materials are preferred because of their excellent reflective characteristics, bi-stability and gray scale memory. The chiral nematic liquid crystal is typically a mixture of nematic liquid crystal and chiral material in an amount sufficient to produce the desired pitch length. Suitable commercial nematic liquid crystals include, for example, E7, E44, E48, E31, E80, BL087, BL101, ZLI-3308, ZLI-3273, ZLI-5048-000, ZLI-5049-100, ZLI-5100-100, ZLI-5800-000, MLC-6041-100.TL202, TL203, TL204 and TL205 manufactured by E. Merck (Darmstadt, Germany). Although nematic liquid crystals having positive dielectric anisotropy, and especially cyanobiphenyls, are preferred, virtually any nematic liquid crystal known in the art, including those having negative dielectric anisotropy should be suitable for use in the invention. Other nematic materials may also be suitable for use in the present invention as would be appreciated by those skilled in the art.

The chiral dopant added to the nematic mixture to induce the helical twisting of the mesophase, thereby allowing reflection of visible light, can be of any useful structural class. The choice of dopant depends upon several characteristics including among others its chemical compatibility with the nematic host, helical twisting power, temperature sensitivity, and light fastness. Many chiral dopant classes are known in the art: e.g., G. Gottarelli and G. Spada, Mol. Cryst. Liq. Crys., 123, 377 (1985); G. Spada and G. Proni, Enantiomer, 3, 301 (1998) and references therein. Typical well-known dopant classes include 1,1-binaphthol derivatives; isosorbide (D-1) and similar isomannide esters as disclosed in U.S. Pat. No. 6,217,792; TADDOL derivatives (D-2) as disclosed in U.S. Pat. No. 6,099,751; and the pending spiroindanes esters (D-3) as disclosed in U.S. patent application Ser. No. 10/651, 692 by T. Welter et al., filed Aug. 29, 2003, titled "Chiral Compounds And Compositions Containing The Same," hereby incorporated by reference.

D-1

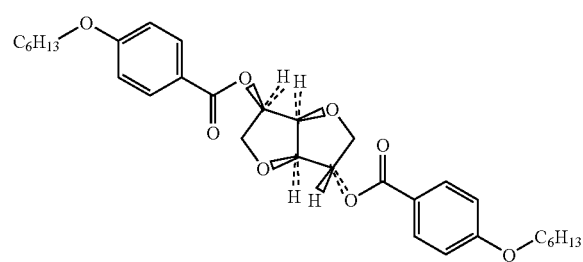

-continued

D-2

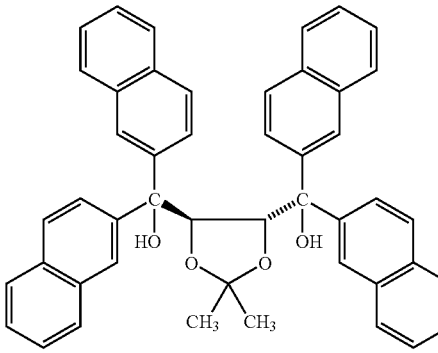

D-3

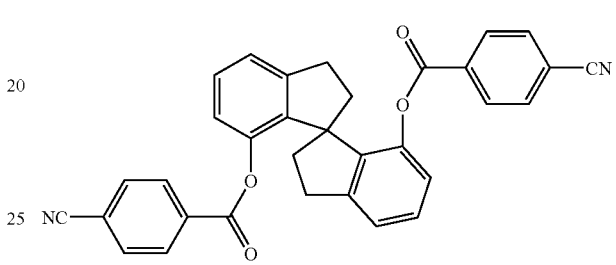

The pitch length of the liquid crystal materials may be adjusted based upon the following equation (1):

$$\lambda_{max} = n_{av} p0$$

where $\lambda_{max}$ is the peak reflection wavelength, that is, the wavelength at which reflectance is a maximum, $n_{av}$ is the average index of refraction of the liquid crystal material, and p0 is the natural pitch length of the chiral nematic helix. Definitions of chiral nematic helix and pitch length and methods of its measurement, are known to those skilled in the art such as can be found in the book, Blinov, L. M., Electro-optical and Magneto-Optical Properties of Liquid Crystals, John Wiley & Sons Ltd. 1983. The pitch length is modified by adjusting the concentration of the chiral material in the liquid crystal material. For most concentrations of chiral dopants, the pitch length induced by the dopant is inversely proportional to the concentration of the dopant. The proportionality constant is given by the following equation (2):

$$p0 = 1/(HTP \cdot c)$$

where c is the concentration of the chiral dopant and HTP (as termed □ in some references) is the proportionality constant.

For some applications, it is desired to have LC mixtures that exhibit a strong helical twist and thereby a short pitch length. For example in liquid crystalline mixtures that are used in selectively reflecting chiral nematic displays, the pitch has to be selected such that the maximum of the wavelength reflected by the chiral nematic helix is in the range of visible light. Other possible applications are polymer films with a chiral liquid crystalline phase for optical elements, such as chiral nematic broadband polarizers, filter arrays, or chiral liquid crystalline retardation films. Among these are active and passive optical elements or color filters and liquid crystal displays, for example STN, TN, AMD-TN, temperature compensation, polymer free or polymer stabilized chiral nematic texture (PFCT, PSCT) displays. Possible display industry applications include ultralight, flexible, and inexpensive displays for notebook and desktop computers, instrument panels, video game machines, videophones, mobile phones, hand-held PCs, PDAs, e-books, camcorders, satellite navigation systems, store and supermarket pricing systems, highway signs, informational displays, smart cards, toys, and other electronic devices.

There are alternative display technologies to LCDs that may be used, for example, in flat panel displays. A notable example is organic or polymer light emitting devices (OLEDs) or (PLEDs), which are comprised of several layers in which one of the layers is comprised of an organic material that can be made to electroluminesce by applying a voltage across the device. An OLED device is typically a laminate formed in a substrate such as glass or a plastic polymer. Alternatively, a plurality of these OLED devices may be assembled such to form a solid state lighting display device.

A light emitting layer of a luminescent organic solid, as well as adjacent semiconductor layers, are sandwiched between an anode and a cathode. The semiconductor layers may be hole injecting and electron injecting layers. PLEDs may be considered a subspecies of OLEDs in which the luminescent organic material is a polymer. The light emitting layers may be selected from any of a multitude of light emitting organic solids, e.g., polymers that are suitably fluorescent or chemiluminescent organic compounds. Such compounds and polymers include metal ion salts of 8-hydroxyquinolate, trivalent metal quinolate complexes, trivalent metal bridged quinolate complexes, Schiff-based divalent metal complexes, tin (IV) metal complexes, metal acetylacetonate complexes, metal bidenate ligand complexes incorporating organic ligands, such as 2-picolylketones, 2-quinaldylketones, or 2-(o-phenoxy)pyridine ketones, bis-phosphonates, divalent metal maleonitriledithiolate complexes, molecular charge transfer complexes, rare earth mixed chelates, (5-hydroxy) quinoxaline metal complexes, aluminum tris-quinolates, and polymers such as poly(p-phenylenevinylene), poly(dialkoxyphenylenevinylene), poly (thiophene), poly(fluorene), poly(phenylene), poly(phenylacetylene), poly(aniline), poly(3-alkylthiophene), poly(3-octylthiophene), and poly(N-vinylcarbazole). When a potential difference is applied across the cathode and anode, electrons from the electron injecting layer and holes from the hole injecting layer are injected into the light emitting layer; they recombine, emitting light. OLEDs and PLEDs are described in the following United States patents: U.S. Pat. No. 5,707,745 to Forrest et al., U.S. Pat. No. 5,721,160 to Forrest et al., U.S. Pat. No. 5,757,026 to Forrest et al., U.S. Pat. No. 5,834,893 to Bulovic et al., U.S. Pat. No. 5,861,219 to Thompson et al., U.S. Pat. No. 5,904,916 to Tang et al., U.S. Pat. No. 5,986,401 to Thompson et al., U.S. Pat. No. 5,998, 803 to Forrest et al., U.S. Pat. No. 6,013,538 to Burrows et al., U.S. Pat. No. 6,046,543 to Bulovic et al., U.S. Pat. No. 6,048, 573 to Tang et al., U.S. Pat. No. 6,048,630 to Burrows et al., U.S. Pat. No. 6,066,357 to Tang et al., U.S. Pat. No. 6,125,226 to Forrest et al., U.S. Pat. No. 6,137,223 to Hung et al., U.S. Pat. No. 6,242,115 to Thompson et al., and U.S. Pat. No. 6,274,980 to Burrows et al.

In a typical matrix address light emitting display device, numerous light emitting devices are formed on a single substrate and arranged in groups in a regular grid pattern. Activation may be by rows and columns, or in an active matrix with individual cathode and anode paths. OLEDs are often manufactured by first depositing a transparent electrode on the substrate, and patterning the same into electrode portions. The organic layer(s) is then deposited over the transparent electrode. A metallic electrode may be formed over the organic layers. For example, in U.S. Pat. No. 5,703, 436 to Forrest et al., incorporated herein by reference, transparent indium tin oxide (ITO) is used as the hole injecting electrode, and a Mg—Ag-ITO electrode layer is used for electron injection.

The present invention can be employed in most OLED device configurations as an electrode, preferably as an anode, and/or any other operational or non-operational layer. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

Figure 5:
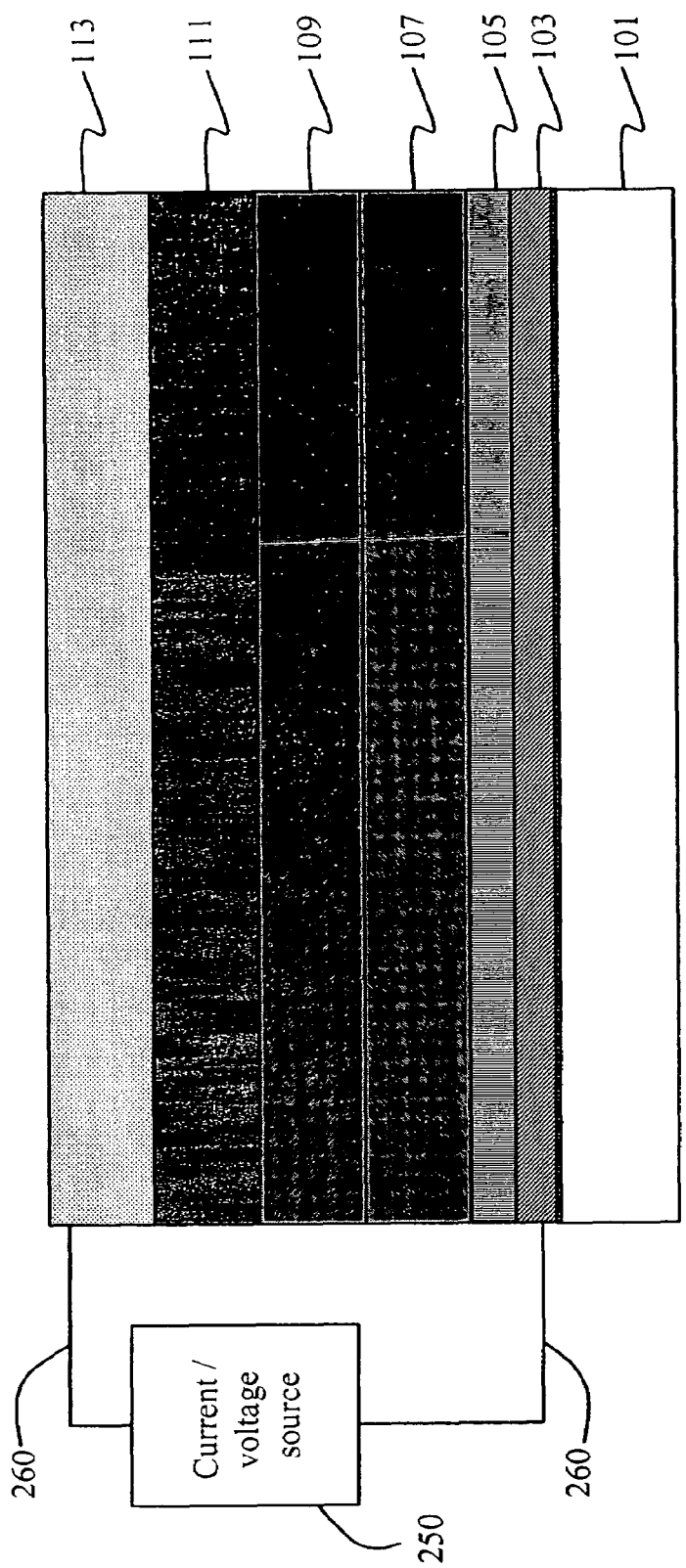
FIG. 5 shows a schematic of an OLED based display formed by the methods of the invention.

There are numerous configurations of the organic layers wherein the present invention can be successfully practiced. A typical structure is shown in FIG. 5 and is comprised of a substrate 101, an anode 103, a hole-injecting layer 105, a hole-transporting layer 107, a light-emitting layer 109, an electron-transporting layer 111, and a cathode 113. These layers are described in more detail below. Note that the substrate may alternatively be located adjacent to the cathode, or the substrate may actually constitute the anode or cathode. The organic layers between the anode and cathode are conveniently referred to as the organic electroluminescent (EL) element. The total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

When EL emission is viewed through anode 103, the anode should be transparent or substantially transparent to the emission of interest. Thus, the FOM of this invention is critical for such OLED display devices. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are generally immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

The electrically imageable material may also be a printable, conductive ink having an arrangement of particles or microscopic containers or microcapsules. Each microcapsule contains an electrophoretic composition of a fluid, such as a dielectric or emulsion fluid, and a suspension of colored or charged particles or colloidal material. The diameter of the microcapsules typically ranges from about 30 to about 300 microns. According to one practice, the particles visually contrast with the dielectric fluid. According to another example, the electrically modulated material may include rotatable balls that can rotate to expose a different colored surface area, and which can migrate between a forward viewing position and/or a rear nonviewing position, such as gyricon. Specifically, gyricon is a material comprised of twisting rotating elements contained in liquid filled spherical cavities and embedded in an elastomer medium. The rotating elements may be made to exhibit changes in optical properties by the imposition of an external electric field. Upon application of an electric field of a given polarity, one segment of a rotating element rotates toward, and is visible by an observer of the display. Application of an electric field of opposite polarity, causes the element to rotate and expose a second, different segment to the observer. A gyricon display maintains a given configuration until an electric field is actively applied to the display assembly. Gyricon particles typically have a diameter of about 100 microns. Gyricon materials are disclosed in U.S. Pat. No. 6,147,791, U.S. Pat. No. 4,126,854 and U.S. Pat. No. 6,055,091, the contents of which are herein incorporated by reference.

According to one practice, the microcapsules may be filled with electrically charged white particles in a black or colored dye. Examples of electrically modulated material and methods of fabricating assemblies capable of controlling or effecting the orientation of the ink suitable for use with the present invention are set forth in International Patent Application Publication Number WO 98/41899, International Patent Application Publication Number WO 98/19208, International Patent Application Publication Number WO 98/03896, and International Patent Application Publication Number WO 98/41898, the contents of which are herein incorporated by reference.

The electrically imageable material may also include material disclosed in U.S. Pat. No. 6,025,896, the contents of which are incorporated herein by reference. This material comprises charged particles in a liquid dispersion medium encapsulated in a large number of microcapsules. The charged particles can have different types of color and charge polarity. For example white positively charged particles can be employed along with black negatively charged particles. The described microcapsules are disposed between a pair of electrodes, such that a desired image is formed and displayed by the material by varying the dispersion state of the charged particles. The dispersion state of the charged particles is varied through a controlled electric field applied to the electrically modulated material. According to a preferred embodiment, the particle diameters of the microcapsules are between about 5 microns and about 200 microns, and the particle diameters of the charged particles are between about one-thousandth and one-fifth the size of the particle diameters of the microcapsules.

Further, the electrically imageable material may include a thermochromic material. A thermochromic material is capable of changing its state alternately between transparent and opaque upon the application of heat. In this manner, a thermochromic imaging material develops images through the application of heat at specific pixel locations in order to form an image. The thermochromic imaging material retains a particular image until heat is again applied to the material. Since the rewritable material is transparent, UV fluorescent printings, designs and patterns underneath can be seen through.

The electrically imageable material may also include surface stabilized ferroelectric liquid crystals (SSFLC). Surface stabilized ferroelectric liquid crystals confining ferroelectric liquid crystal material between closely spaced glass plates to suppress the natural helix configuration of the crystals. The cells switch rapidly between two optically distinct, stable states simply by alternating the sign of an applied electric field.

Magnetic particles suspended in an emulsion comprise an additional imaging material suitable for use with the present invention. Application of a magnetic force alters pixels formed with the magnetic particles in order to create, update or change human and/or machine readable indicia. Those skilled in the art will recognize that a variety of bistable nonvolatile imaging materials are available and may be implemented in the present invention.

The electrically imageable material may also be configured as a single color, such as black, white or clear, and may be fluorescent, iridescent, bioluminescent, incandescent, ultraviolet, infrared, or may include a wavelength specific radiation absorbing or emitting material. There may be multiple layers of electrically imageable material. Different layers or regions of the electrically imageable material display material may have different properties or colors. Moreover, the characteristics of the various layers may be different from each other. For example, one layer can be used to view or display information in the visible light range, while a second layer responds to or emits ultraviolet light. The nonvisible layers may alternatively be constructed of non-electrically modulated material based materials that have the previously listed radiation absorbing or emitting characteristics. The electrically imageable material employed in connection with the present invention preferably has the characteristic that it does not require power to maintain display of indicia.

Another application of the invention is envisioned for touch screens. Touch screens are widely used in conventional CRTs and in flat-panel display devices in computers and in particular with portable computers. The present invention can be applied as a transparent conductive member in any of the touch screens known in the art, including but not limited to those disclosed in U.S. Pat. Appl. Pub. 2003/0170456 A1; 2003/0170492 A1; U.S. Pat. No. 5,738,934; and WO 00/39835.

Figure 6:
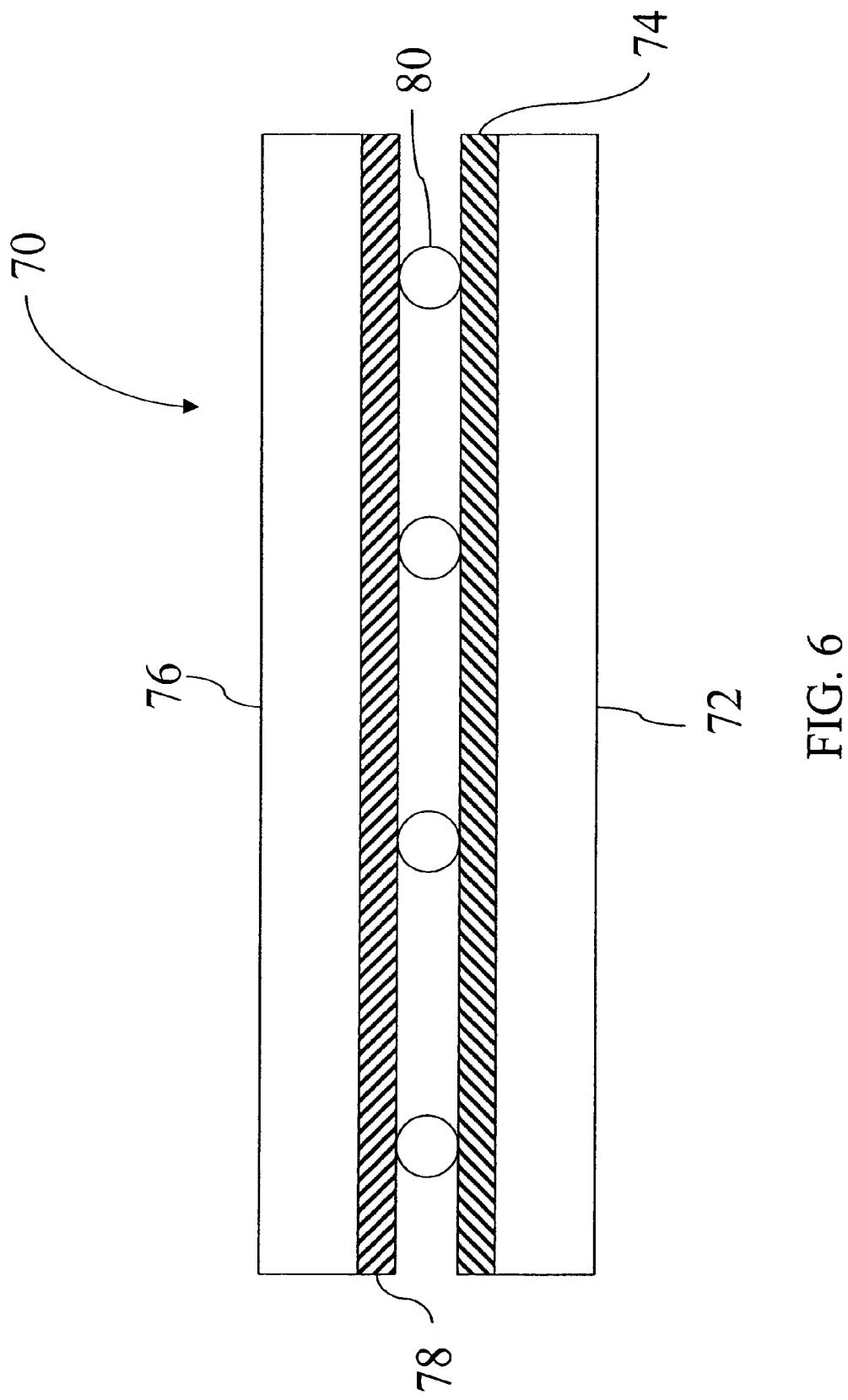
FIG. 6 shows a schematic of a resistive-type touch screen formed by the methods of the invention.

FIG. 6 shows a multilayered item 70 for a typical prior art resistive-type touch screen including a transparent substrate 72, having a first conductive layer 74. A flexible transparent cover sheet 76 includes a second conductive layer 78 that is physically separated from the first conductive layer 74 by spacer elements 80. A voltage is developed across the conductive layers. The conductive layers 74 and 78 have a resistance selected to optimize power usage and position sensing accuracy. Deformation of the flexible cover sheet 76 by an external object such as a finger or stylus causes the second conductive layer 78 to make electrical contact with first conductive layer 74, thereby transferring a voltage between the conductive layers. The magnitude of this voltage is measured through connectors (not shown) connected to metal conductive patterns (not shown) formed on the edges of conductive layers 78 and 74 to locate the position of the deforming object.

The conventional construction of a resistive touch screen involves the sequential placement of materials upon the substrate. The substrate 72 and cover sheet 76 are first cleaned, then uniform conductive layers are applied to the substrate and cover sheet. It is known to use a coatable electronically conductive polymer such as polythiophene or polyaniline to provide the flexible conductive layers. See for example WO 00/39835, which shows a light transmissive substrate having a light transmissive conductive polymer coating, and U.S. Pat. No. 5,738,934 which shows a cover sheet having a conductive polymer coating. The spacer elements 80 are then applied and, finally, the flexible cover sheet 76 is attached.

For many applications, specific functional layers in devices may have patterned structures. For example patterning of color filters, black matrix, spacers, polarizers, conductive layers, transistors, phosphors, and organic electroluminescent materials have all been proposed. In accordance with the present invention, a patterned structure can be obtained by (i) pre-patterning all or any part of the transfer layer before transfer, (ii) patterning all or any part of the transfer layer after transfer and (iii) pattern-wise transfer of all or any part of the transfer layer during transfer.

A field effect transistor (FET) can be formed using one or more donor laminates. One example of an organic field effect transistor that could be formed using donor laminates is described in Gamier, et al., Adv. Mater. 2, 592-594 (1990). Similar examples are illustrated in U.S. Pat. No. 6,586,153 and references therein. Any of the known art can be implemented for the practice of the present invention.

EXAMPLES

Donor Laminates

The donor laminates used in the following examples comprised of, a substrate, a silocone layer and a conductive coating, in the aforementioned order.

The substrate used was either polyethylene terephthalate (PET) or triacetylcellulose (TAC).

The silicone layer was either a solvent coated 3-glycidoxypropyltrimethoxysilane layer (RL-1) or a thermally cured silicone layer commercially available from Rexam Corporation (RL-2).

The conductive coating was applied onto the silocone layer from a coating composition comprising the following ingredients:
(a) Baytron P HC: aqueous dispersion of electronically conductive polythiophene and polyanion, namely, poly(3,4-ethylene dioxythiophene styrene sulfonate), supplied by H. C. Starck;
(b) Olin 10G: nonionic surfactant supplied by Olin Chemicals;
(c) N-methylpyrrolidone: conductivity enhancing agent supplied by Acros;
(d) diethylene glycol: conductivity enhancing agent supplied by Aldrich;
(e) isopropanol;

mixed in the following ratio to form conductive coating composition A:

Conductive Coating Composition A

| | |
|---|---|
| Baytron P HC (1.3% aqueous) | 88.71 g |
| Olin 10G (10% aqueous) | 0.5 g |
| N-methylpyrrolidone | 5.16 g |
| Diethylene glycol | 4 g |
| Isopropanol | 6.13 g |

The coating composition A was applied to the silicone layer on the substrate by a hopper at different wet lay downs, and each coating was dried at 82° C. for five minutes. In this manner, examples of donor laminates DL-1 through DL-7 were created as per invention, wherein conductive layers of different coverage of electronically conductive polythiophene and polyanions of polystyrenesulfonic acid were coated on the surface of the silicone layer of a substrate.

The surface electrical resistivity (SER) of each conductive coating was measured by a 4-point electrical probe. The details of the donor laminates and their properties are tabulated below in Table 1.

TABLE 1

| Example | Substrate | Silicone layer | Conductive coating composition | SER ohms/square |
|---|---|---|---|---|
| DL-1 | PET | RL-1 | A | 305 |
| DL-2 | PET | RL-1 | A | 335 |
| DL-3 | PET | RL-1 | A | 404 |
| DL-4 | TAC | RL-1 | A | 301 |
| DL-5 | TAC | RL-1 | A | 330 |
| DL-6 | PET | RL-2 | A | 240 |
| DL-7 | PET | RL-2 | A | 392 |

It is very clear that exemplary donor laminates DL-1 through DL-5 all have SER much less than 1000 ohms/square.

Receiver

The following receivers were used for the transfer of the conductive layer as per the invention:

R-1: A 102 μm PET substrate with an adhesion promoting subbing layer of a terpolymer of acrylonitrile, vinylidene chloride and acrylic acid in the weight ratio of 15/79/6 and having a glass transition temperature of 42° C.

R-2: same as R-1 with an additional layer of ~0.1 μm of gelatin over the terpolymer based subbing layer.

R-3: same as R-1 with an additional layer of ~1 μm of gelatin over the terpolymer based subbing layer.

Transfer Method:

Donor laminate DL-3 and receiver R-1 are schematically illustrated in FIG. 7. As per FIG. 7A the donor laminate DL-3 consists of a PET substrate 90, which is coated with a silicone layer 92 (RL-1), and further coated with a conductive layer 94 comprising electronically conductive polythiophene and polyanions of polystyrenesulfonic acid. As per FIG. 7B, the receiver R-1 consists of a PET substrate 96, coated with an adhesion promoting subbing layer 98 of a terpolymer of acrylonitrile, vinylidene chloride and acrylic acid.

Figure 8:
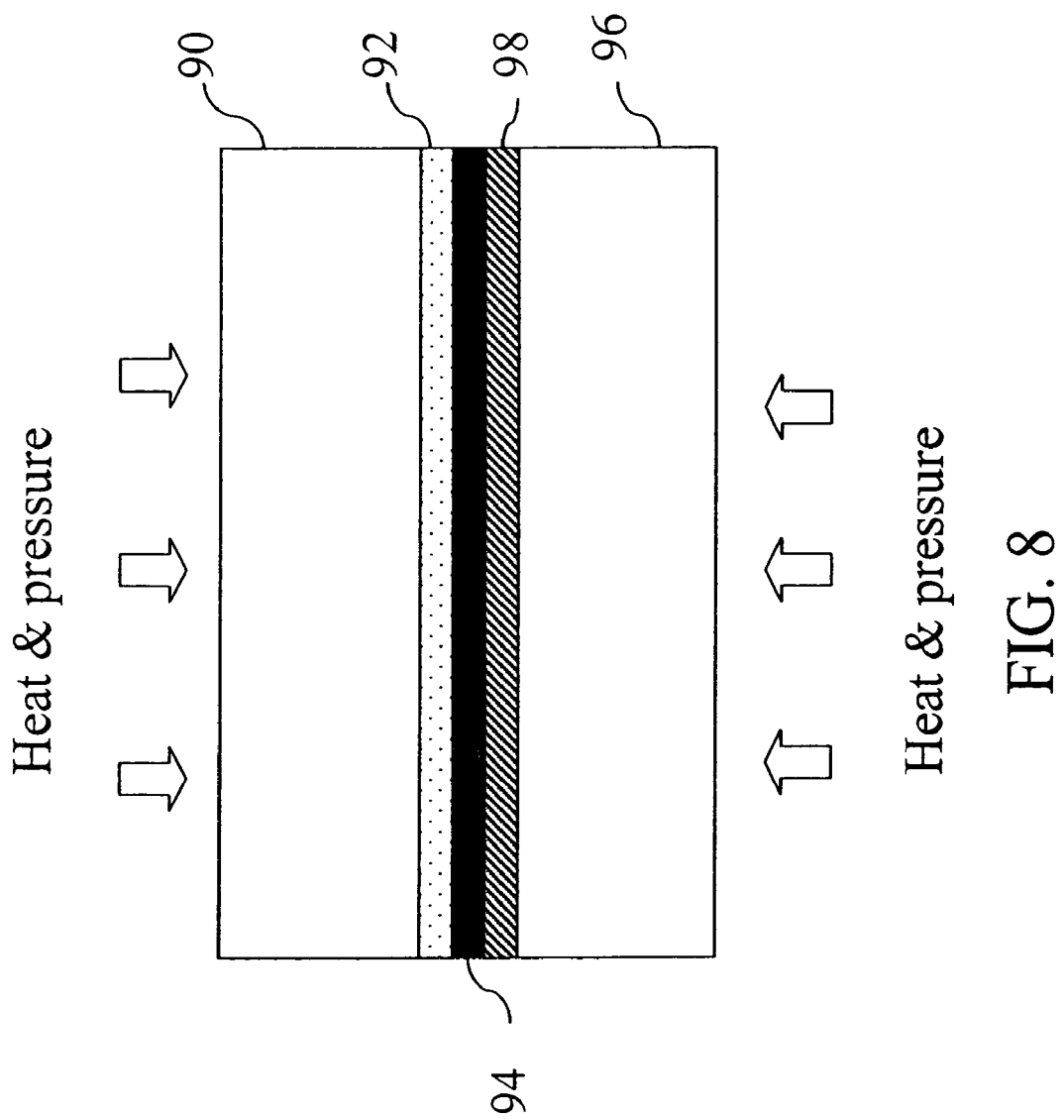
FIG. 8 shows a cross-sectional representation of a donor laminate of the invention in contact with a receiver element.
Figure 9:
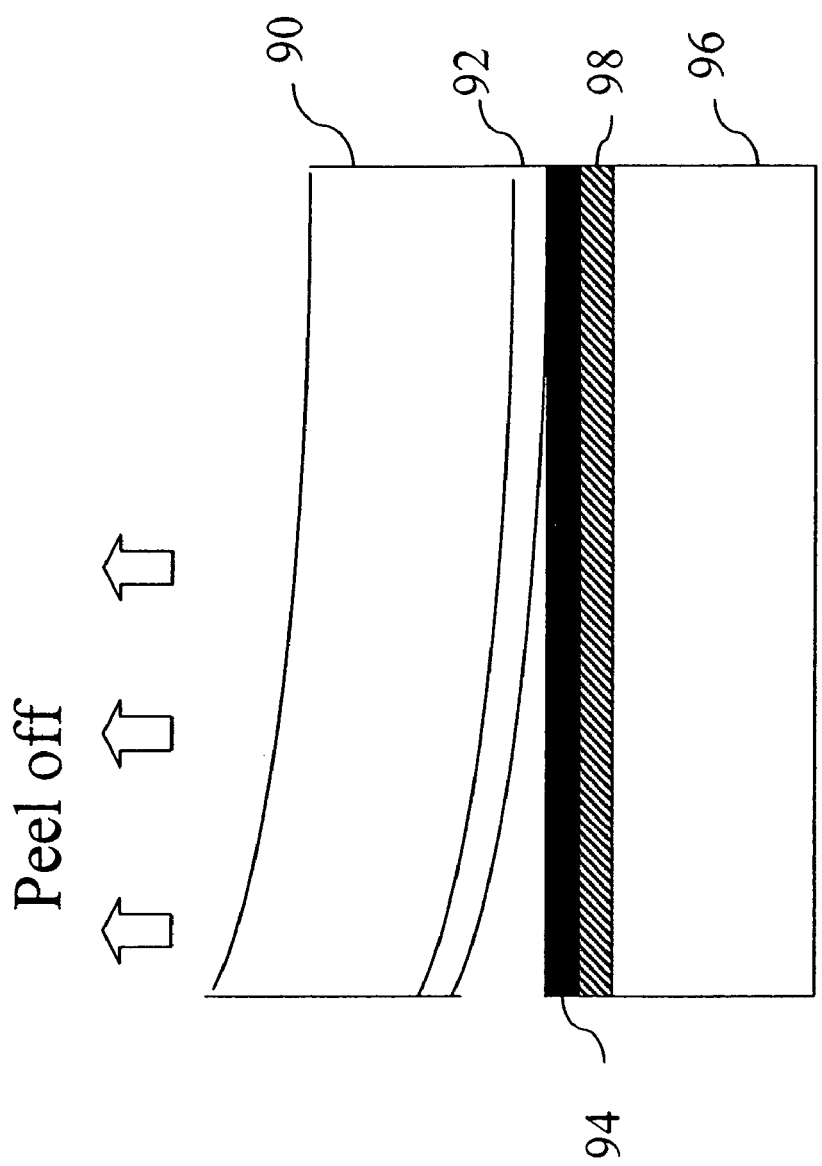
FIG. 9 shows a cross-sectional representation of a receiver element having a conductive layer that has been transferred by the method of the invention.

The donor laminate DL-3 and receiver R-1 were brought in close contact with each other, with the subbing layer 98 of R-1 touching the conductive layer 94 of DL-3, and were passed through the nip between a pair of heated laminating rollers, which exerted pressure and heat to the combination, as schematically represented in FIG. 8. Upon a single pass, a composite was created wherein the donor laminate and the receiver adhered to each other. Next the PET substrate 90 together with the silicone layer 92 of donor laminate DL-3 was peeled off from the composite, as schematically shown in FIG. 9, leaving behind the conductive layer 94 transferred to the subbing layer 98 of receiver R-1.

Following the same process, the conductive layers from various donor laminates were transferred to various receivers with essentially no loss in conductive properties, as noted in Table 2 below. It is clear also clear from Table 2 that conductive layers comprising electronically conductive polythiophene and polyanions of polystyrenesulfonic acid with SER values much below 1000 ohms/square can be successfully transferred from various donor laminates to receivers, as per the invention.

TABLE 2

| Donor laminate | SER (ohms/square) of conductive layer on donor laminate (before transfer) | Receiver | Receiving layer | SER (ohms/square) of conductive layer on receiver (after transfer) |
|---|---|---|---|---|
| DL-1 | 305 | R-1 | terpolymer | 348 |
| DL-1 | 305 | R-2 | 0.1 μm gelatin | 336 |
| DL-2 | 335 | R-2 | 0.1 μm gelatin | 346 |
| DL-3 | 404 | R-2 | 0.1 μm gelatin | 432 |
| DL-4 | 301 | R-1 | terpolymer | 302 |
| DL-4 | 301 | R-3 | 1 μm gelatin | 300 |
| DL-5 | 330 | R-1 | terpolymer | 324 |
| DL-5 | 330 | R-3 | 1 μm gelatin | 322 |
| DL-6 | 240 | R-3 | 1 μm gelatin | 272 |
| DL-7 | 392 | R-3 | 1 μm gelatin | 462 |

The invention has been described in detail with particular reference to certain preferred embodiments thereof, but it will be understood that variations and modifications can be effected within the spirit and scope of the invention.

PARTS LIST

| | |
|---|---|
| 10 | conductive layer |
| 12 | substrate |
| 14 | donor laminate |
| 16 | silicone layer |
| 20 | silicone layer |
| 22 | conductive layer |
| 24 | dielectric layer |
| 26 | adhesive layer |
| 28 | substrate |
| 30 | donor laminate |
| 40 | second conductive layer |
| 42 | dielectric layer |
| 44 | conductive row contacts |
| 46 | nanopigmented layer |
| 48 | light modulating liquid crystal layer |
| 50 | LCD item |
| 52 | first conductive layer |
| 54 | substrate |
| 60 | display component |
| 64 | conductive polymer layer |
| 62 | receiver substrate |
| 66 | power source |
| 68 | electric lead |
| 70 | resistive touch screen |
| 72 | substrate |
| 74 | first conductive layer |
| 76 | cover sheet |
| 78 | second conductive layer |
| 80 | spacer element |
| 90 | PET substrate |
| 92 | silicone layer |
| 94 | conductive layer |
| 96 | PET substrate |
| 98 | terpolymer layer |
| 101 | substrate |
| 103 | anode |
| 105 | hole-injecting layer |
| 107 | hole-transporting layer |
| 109 | light-emitting layer |
| 111 | electron-transporting layer |
| 113 | cathode |
| 250 | voltage/current source |
| 260 | electrical conductors |

The invention claimed is:

1. A donor laminate for transfer of a conductive layer comprising a substrate having thereon in order a silicone layer and a conductive layer comprising at least one electronically conductive polymer and a polyanion, in contact with said silicone layer, wherein the silicone layer has a surface energy of <30 mN/m, and the conductive layer is coated on the silicone layer from an aqueous coating composition comprising a dispersible combination of the electronically conductive polymer and polyanion and has a surface electrical resistance of less than 10000 ohm/square.

2. The laminate of claim 1 wherein said conductive layer is in a pattern.

3. The laminate of claim 1 wherein said conductive layer comprises polyethylene dioxythiophene.

4. The laminate of claim 1 wherein said conductive layer comprises polystyrene sulfonate.

5. The laminate of claim 1 wherein said substrate comprises a polymer selected from the group consisting of cellulose ester, polyester and polyolefin polymers.

6. The laminate of claim 1 wherein said silicone layer comprises a cross-linked silicone.

7. The laminate of claim 1 wherein said conductive layer has a peel force of less than 100 grams per inch for separation from said release layer at room temperature.

8. The laminate of claim 1 wherein said conductive layer has a peel force of less than 50 grams per inch for separation from said release layer at room temperature.

9. The laminate of claim 1 wherein said silicone layer is coated from silicone modified by a functionality selected from the group consisting of epoxy, acrylate, and ester.

10. The laminate of claim 1 wherein said laminate further comprises an adhesive layer on the side of the conductive layer opposite to the substrate.

11. The laminate of claim 1 wherein said conductive layer is a transparent conductive layer comprising an electronically conductive polymer comprising polythiophene present in a cationic form with a polyanion, wherein said conductive layer has an FOM less than or equal to 100 wherein FOM is defined as the slope of the plot of ln (1/T) versus [1/SER]: and wherein
T=visual light transmission
SER=surface electrical resistance in ohm per square
FOM=figure of merit, and
wherein the SER has a value of less than or equal to 1000 ohm per square.

12. The laminate of claim 11 wherein said conductive layer has a visual light transmission of greater than 90%.

13. The laminate of claim 1 wherein said conductive layer is coated utilizing a conductivity enhancing agent.

14. The laminate of claim 11 wherein the figure of merit is less than or equal to 40.

15. The laminate of claim 1 wherein said conductive layer has a peel force of less than 100 grams per inch for separation from said substrate at 300° C.

16. The laminate of claim 11 wherein said conductive layer has a peel force of less than 50 grams per inch for separation from said substrate.

17. The laminate of claim 11 wherein said laminate further comprises an adhesive layer on the side of the conductive layer opposite to the substrate.

* * * * *